(12) United States Patent
Huang

(10) Patent No.: US 11,437,314 B2
(45) Date of Patent: Sep. 6, 2022

(54) SEMICONDUCTOR DEVICE WITH ANTI-FUSE AND METAL-INSULATOR-METAL (MIM) CAPACITOR CONNECTED TO REDISTRIBUTION LAYER (RDL) AND METHOD FOR FORMING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 26 days.

(21) Appl. No.: 17/107,035

(22) Filed: Nov. 30, 2020

(65) Prior Publication Data

US 2022/0173037 A1 Jun. 2, 2022

(51) Int. Cl.
*H01L 23/525* (2006.01)
*H01L 23/522* (2006.01)

(52) U.S. Cl.
CPC ...... *H01L 23/5252* (2013.01); *H01L 23/5223* (2013.01)

(58) Field of Classification Search
CPC .............. H01L 23/5252; H01L 23/5223

USPC .......................................... 257/530
See application file for complete search history.

(56) References Cited

U.S. PATENT DOCUMENTS

2004/0129999 A1* 7/2004 Jung .................. H01L 23/5252
257/E21.018

* cited by examiner

Primary Examiner — Quoc D Hoang
(74) Attorney, Agent, or Firm — Muncy, Geissler, Olds & Lowe, P.C.

(57) ABSTRACT

The present disclosure provides a semiconductor device with an anti-fuse and a metal-insulator-metal (MIM) capacitor connected to a redistribution layer (RDL) and a method for forming the semiconductor device. The semiconductor device includes a first conductive portion and a second conductive portion disposed over a semiconductor substrate. The semiconductor device also includes a passivation layer covering the first conductive portion and the second conductive portion. The first conductive portion, the second conductive portion and a portion of the passivation layer therebetween form an anti-fuse. The semiconductor device further includes a first metal-insulator-metal (MIM) capacitor and a first redistribution layer (RDL) disposed over the passivation layer. The first MIM capacitor and the first RDL are electrically connected to the first conductive portion, and a first metal layer of the first MIM capacitor is integrally formed with the first RDL.

18 Claims, 21 Drawing Sheets a semiconductor device and a method for forming the same, and more particularly, to a semiconductor device with an anti-fuse and a metal-insulator-metal (MIM) capacitor connected to a redistribution layer (RDL) and a method for forming the same.

SEMICONDUCTOR DEVICE WITH ANTI-FUSE AND METAL-INSULATOR-METAL (MIM) CAPACITOR CONNECTED TO REDISTRIBUTION LAYER (RDL) AND METHOD FOR FORMING THE SAME

TECHNICAL FIELD

The present disclosure relates to a semiconductor device and a method for forming the same, and more particularly, to a semiconductor device with an anti-fuse and a metal-insulator-metal (MIM) capacitor connected to a redistribution layer (RDL) and a method for forming the same.

DISCUSSION OF THE BACKGROUND

Integrated circuit (IC) devices are usually made with all internal connections set during the manufacturing process. However, due to high development costs, long manufacturing times, and high manufacturing tooling costs for forming such IC devices, users often desire circuits which can be configured or programmed in the field. Such circuits are called programmable circuits and they usually contain programmable links. Programmable links are electrical interconnects which are either broken or created at selected electronic nodes by the user after the IC device has been fabricated and packaged in order to activate or deactivate respective selected electronic nodes.

One type of the programmable links is a fuse structure. The programmable links in the IC devices are programmed by blowing the fuse structure at selected cross-over points to create an open circuit. The combination of blown and unblown links represents a digital bit pattern of ones and zeros signifying data which the user wishes to store in the IC device. Another type of the programmable links is an anti-fuse structure. Instead of the programming mechanism causing an open circuit in the case with fuse structures, the programming mechanism in the anti-fuse structure creates a short circuit or a relatively low resistance link therein.

In integration circuit fabrication, the fuse structure and the anti-fuse structure are widely used for fault tolerance. For example, the fuse structure and the anti-fuse structure may be placed in circuit paths in a semiconductor device. However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the structure and the manufacturing process of semiconductor devices so that the deficiencies can be addressed, and the performance can be enhanced.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a first conductive portion and a second conductive portion disposed over a semiconductor substrate. The semiconductor device also includes a passivation layer covering the first conductive portion and the second conductive portion. The first conductive portion, the second conductive portion and a portion of the passivation layer therebetween form an anti-fuse. The semiconductor device further includes a first metal-insulator-metal (MIM) capacitor and a first redistribution layer (RDL) disposed over the passivation layer. The first MIM capacitor and the first RDL are electrically connected to the first conductive portion, and a first metal layer of the first MIM capacitor is integrally formed with the first RDL.

In an embodiment, the anti-fuse has an air gap between the first conductive portion and the second conductive portion and surrounded by the passivation layer. In an embodiment, the semiconductor device further includes a first insulating layer covering the first metal layer and the first RDL, and a second metal layer disposed over the first insulating layer, wherein the first metal layer, the second metal layer and a portion of the first insulating layer therebetween form the first MIM capacitor. In an embodiment, the first RDL is not covered by the second metal layer.

In an embodiment, the semiconductor device further includes a second metal-insulator-metal (MIM) capacitor and a second redistribution layer (RDL) disposed over the passivation layer, wherein the second MIM capacitor and the second RDL are electrically connected to the second conductive portion, and a third metal layer of the second MIM capacitor is integrally formed with the second RDL. In an embodiment, the semiconductor device further includes a second insulating layer covering the third metal layer and the second RDL, and a fourth metal layer disposed over the second insulating layer, wherein the third metal layer, the fourth metal layer and a portion of the second insulating layer therebetween form the second MIM capacitor. In an embodiment, the semiconductor device further includes a dielectric layer covering the first IM capacitor, wherein the second MIM capacitor and the second RDL are disposed over the dielectric layer.

In another embodiment of the present disclosure, a semiconductor device is provided. The semiconductor device includes a first conductive portion and a second conductive portion disposed over a semiconductor substrate, and a passivation layer covering the first conductive portion and the second conductive portion. The semiconductor device also includes a first conductive plug penetrating through the passivation layer and contacting the first conductive portion, and a second conductive plug penetrating through the passivation layer and contacting the second conductive portion. The semiconductor device further includes an anti-fuse disposed between the first conductive plug and the second conductive plug, and a first metal-insulator-metal (MIM) capacitor disposed over the first conductive plug. In addition, the semiconductor device includes a first redistribution layer (RDL) physically connecting a first metal layer of the first MIM capacitor. The first RDL is electrically connected to the first conductive portion through the first metal layer of the first MIM capacitor and the first conductive plug.

In an embodiment, the semiconductor device further includes a dielectric layer disposed over the passivation layer, wherein the anti-fuse has an air gap enclosed by the dielectric layer and the passivation layer, and the air gap extends between the first conductive portion and the second conductive portion. In an embodiment, a conductive filament is formed between the first conductive portion and the second conductive portion and penetrating through the passivation layer and the air gap after the anti-fuse is programmed. In an embodiment, the first MIM capacitor further includes a second metal layer disposed over the first metal layer, and a first insulating layer sandwiched between the first metal layer and the second metal layer, wherein the first insulating layer extends to cover the first RDL.

In an embodiment, the semiconductor device further includes a second metal-insulator-metal (MIM) capacitor disposed over the second conductive plug, and a second redistribution layer (RDL) physically connecting a third metal layer of the second MIM capacitor, wherein the second RDL is electrically connected to the second conductive portion through the third metal layer of the second MIM capacitor and the second conductive plug. In an embodiment, the second MIM capacitor further includes a fourth metal layer disposed over the third metal layer, and a second insulating layer sandwiched between the third metal layer and the fourth metal layer, wherein the second insulating layer extends to cover the second RDL. In an embodiment, at least a portion of the second RDL overlaps with at least a portion of the first MIM capacitor.

In yet another embodiment of the present disclosure, a method for forming a semiconductor device is provided. The method includes forming a first conductive portion and a second conductive portion over a semiconductor substrate, and depositing a passivation layer over the first conductive portion and the second conductive portion. An opening is formed over the passivation layer and between the first conductive portion and the second conductive portion. The method also includes depositing a first dielectric layer over the passivation layer. The first dielectric layer extends into the opening to form an air gap enclosed by the first dielectric layer and the passivation layer. The method further includes simultaneously forming a first metal layer and a first redistribution layer (RDL) over the first dielectric layer. The first metal layer and the first RDL form a continuous layer. In addition, the method includes forming a first insulating layer to cover the first metal layer and the first RDL, and forming a second metal layer over the first insulating layer. The first metal layer, the second metal layer and a portion of the first insulating layer therebetween form a first metal-insulator-metal (MIM) capacitor, and the first RDL is electrically connected to the first conductive portion through the first MIM capacitor.

In an embodiment, the first conductive portion, the second conductive portion, a portion of the passivation layer therebetween and the air gap form an anti-fuse. In an embodiment, the method further includes applying a programming voltage to the anti-fuse to form a conductive filament penetrating through the portion of the passivation layer and the air gap. In an embodiment, the method further includes forming a second dielectric layer over the first MIM capacitor, and simultaneously forming a third metal layer and a second redistribution layer (RDL) over the second dielectric layer. The third metal layer and the second RDL form a continuous layer.

In an embodiment, the method further includes forming a second insulating layer to cover the third metal layer and the second RDL, and forming a fourth metal layer over the second insulating layer, wherein the third metal layer, the fourth metal layer and a portion of the second insulating layer therebetween form a second metal-insulator-metal (MIM) capacitor. In an embodiment, the second RDL is electrically connected to the second conductive portion through the second MIM capacitor.

Embodiments of a semiconductor device and method for forming the same are provided in the disclosure. In some embodiments, the semiconductor device includes an anti-fuse, a metal-insulator-metal (MIM) capacitor and a redistribution layer (RDL). In some embodiments, the anti-fuse is formed by a first conductive portion, a second conductive portion, and a portion of a passivation layer between the first conductive portion and the second conductive portion. Moreover, the MIM capacitor and the RDL are disposed over and electrically connected to the first conductive portion, and a metal layer of the MIM capacitor is integrally formed with the RDL. As a result, the integration of the semiconductor device may be increased, and the overall size of the semiconductor device may be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
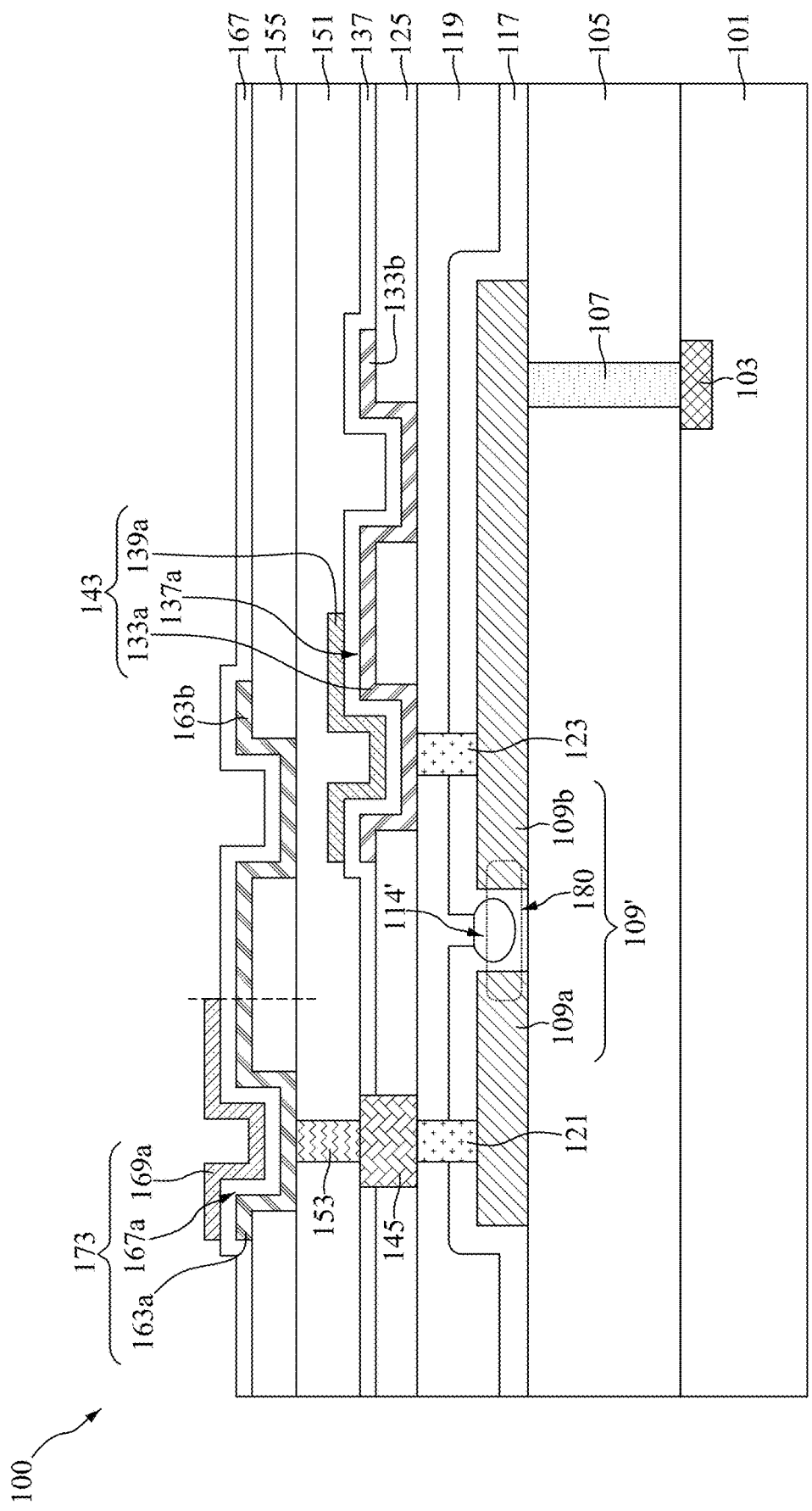
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100, in accordance with some embodiments. As shown in FIG. 1, the semiconductor device 100 includes a semiconductor substrate 101, a dielectric layer 105 disposed over the semiconductor substrate 101, a conductive pad 103 disposed in the semiconductor substrate 101, and a conductive plug 107 disposed in the dielectric layer 105. In some embodiments, the conductive plug 107 is directly over and in physical contact with the conductive pad 103.

In some embodiments, the semiconductor device 100 includes a conductive structure 109' disposed over the dielectric layer 105, and the conductive structure 109' includes conductive portions 109a and 109b. The conductive portion 109b is also referred to herein as a first conductive portion, and the conductive portion 109a is also referred to herein as a second conductive portion. In some embodiments, the conductive portions 109a and 109b are covered by a passivation layer 117, and a dielectric layer 119 is disposed over the passivation layer 117.

In some embodiments, the semiconductor device 100 includes conductive plugs 121 and 123 penetrating through the dielectric layer 119 and the passivation layer 117 and physically contacting the conductive portions 109a and 109b, respectively. The conductive plug 123 is also referred to herein as a first conductive plug, and the conductive plug 121 is also referred to herein as a second conductive plug. In some embodiments, an air gap 114' is formed between the conductive plugs 121 and 123, and between the conductive portions 109a and 109b. Specifically, the air gap 114' is enclosed by the passivation layer 117 and the dielectric layer 119. In some embodiments, the conductive portions 109a and 109b, the portion of the passivation layer 117 between the conductive portions 109a and 109b, and the air gap 114' form an anti-fuse 180.

Moreover, the semiconductor device 100 includes a dielectric layer 125 disposed over the dielectric layer 119, a metal layer 133a and a redistribution layer (RDL) 133b disposed over the dielectric layer 125, an insulating layer 137 disposed over the metal layer 133a and the RDL 133b, and a metal layer 139a disposed over the insulating layer 137. In some embodiments, the metal layers 133a and 139a, and a portion 137a of the insulating layer 137 disposed between the metal layers 133a and 139a form a metal-insulator-metal (MIM) capacitor 143. It should be noted that the metal layer 133a of the MIM capacitor 143 is integrally formed with the RDL 133b. In some embodiments, the metal layer 133a and the RDL 133b are physically connected to each other.

In some embodiments, the metal layer 133a of the MIM capacitor 143 and the RDL 133b penetrate through the dielectric layer 125, and the metal layer 133a physically contacts the conductive plug 123. In some embodiments, the RDL 133b is not covered by the metal layer 139a of the MIM capacitor 143. The MIM capacitor 143 is also referred to herein as a first MIM capacitor, and the RDL 133b is also referred to herein as a first RDL.

In addition, the semiconductor device 100 includes a conductive layer 145 penetrating through the dielectric layer 125 and the insulating layer 137 and physically contacting the conductive plug 121, in accordance with some embodiments. In some embodiments, the semiconductor device 100 includes a dielectric layer 151 disposed over the MIM capacitor 143, and a conductive plug 153 penetrating through the dielectric layer 151. In some embodiments, the MIM capacitor 143 is covered by the dielectric layer 151.

Still referring to FIG. 1, the semiconductor device 100 includes a dielectric layer 155 disposed over the dielectric layer 151, a metal layer 163a and a RDL 163b disposed over the dielectric layer 155, an insulating layer 167 disposed over the metal layer 163a and the RDL 163b, and a metal layer 169a disposed over the insulating layer 167. In some embodiments, the metal layers 163a and 169a, and a portion 167a of the insulating layer 167 disposed between the metal layers 163a and 169a form an MIM capacitor 173. It should be noted that the metal layer 163a of the MIM capacitor 173 is integrally formed with the RDL 163b. In some embodiments, the metal layer 163a and the RDL 163b are physically connected to each other.

In some embodiments, the metal layer 163a of the MIM capacitor 173 and the RDL 163b penetrate through the dielectric layer 155, and the metal layer 163a physically contacts the conductive plug 153. In some embodiments, the RDL 163b is not covered by the metal layer 169a of the MIM capacitor 173. The MIM capacitor 173 is also referred to herein as a second MIM capacitor, and the RDL 163b is also referred to herein as a second RDL.

Figure 2:
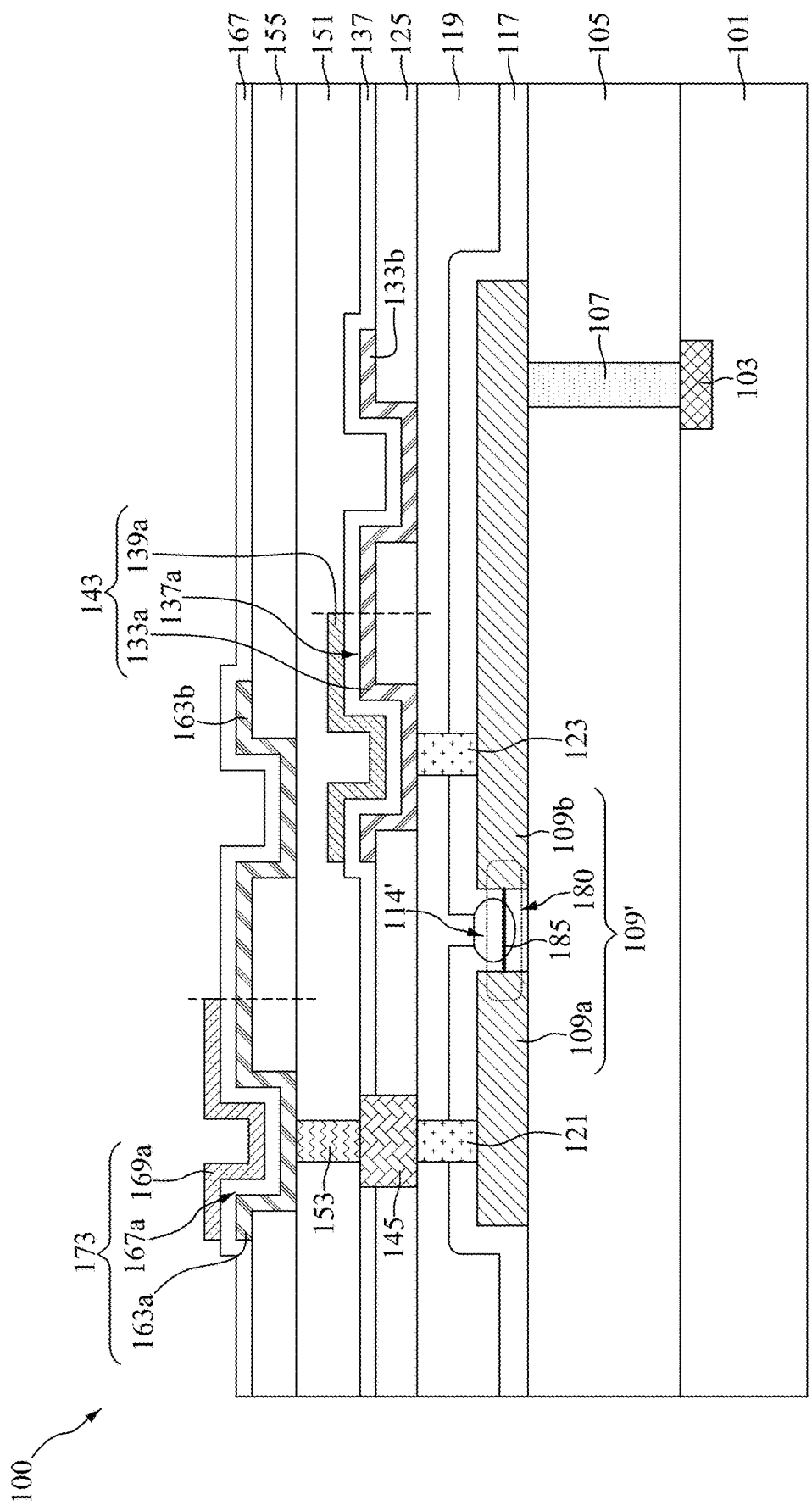
FIG. 2 is a cross-sectional view illustrating the semiconductor device shown in FIG. 1 after programming, in accordance with some embodiments.

FIG. 2 is a cross-sectional view illustrating the semiconductor device 100 shown in FIG. 1. Referring back to FIG. 1, the anti-fuse 180 of the semiconductor device 100 is at a high-resistance state before being programmed. When the programming is performed, a programming voltage is applied between the conductive portions 109a and 109b, and the portion of the passivation layer 117 between the conductive portions 109a and 109b and the air gap 114' are broken down to form a conductive filament 185 between the conductive portions 109a and 109b. Accordingly, the programming turns the anti-fuse 180 from a high-resistance state to a low-resistance state, as shown in FIG. 2 in accordance with some embodiments.

Figure 3:
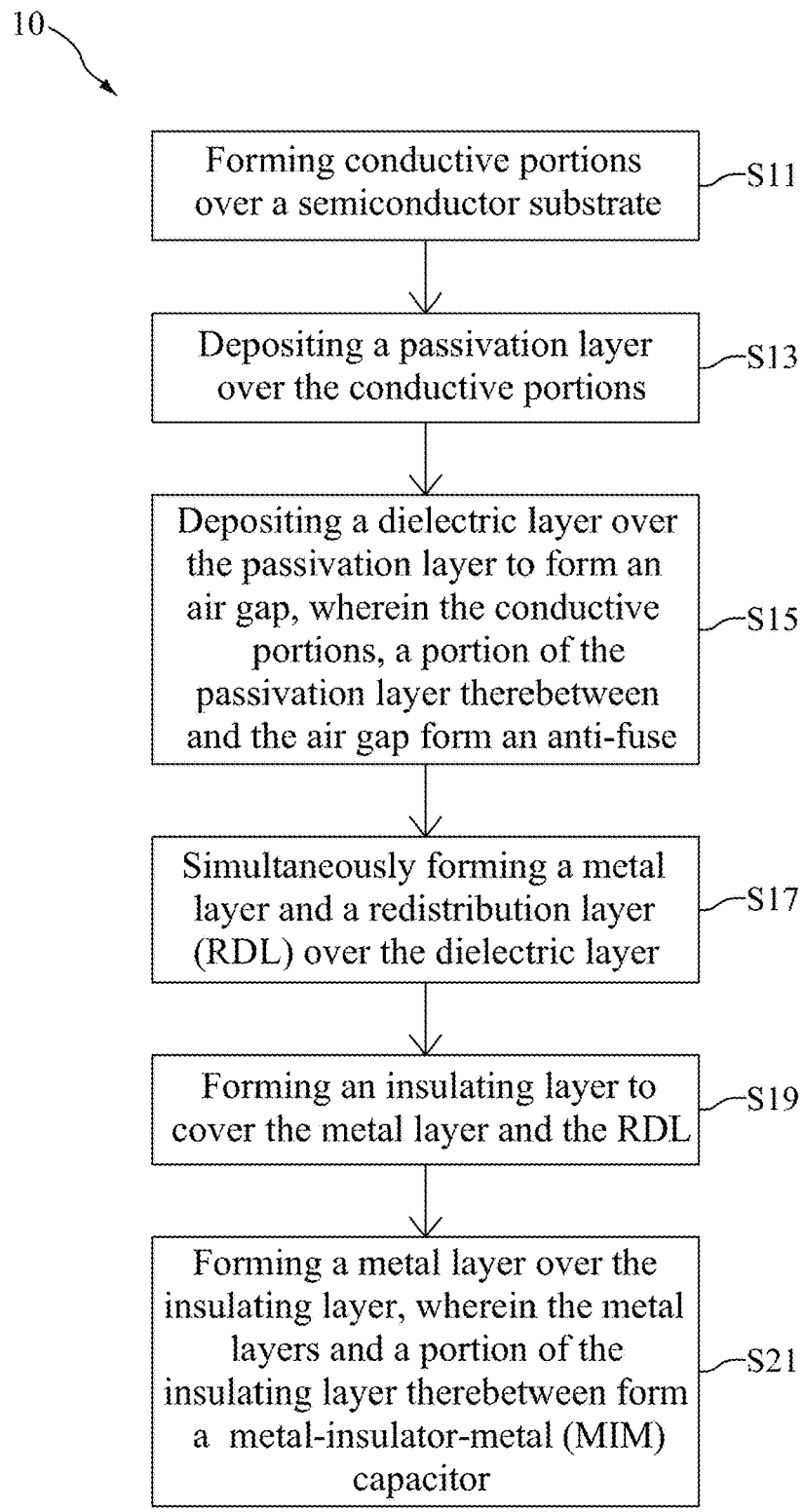
FIG. 3 is a flow diagram illustrating a method for forming a semiconductor device, in accordance with some embodiments.

FIG. 3 is a flow diagram illustrating a method 10 for forming the semiconductor device 100, and the method 10 includes steps S11, S13, S15, S17, S19 and S21, in accordance with some embodiments. The steps S11 to S21 of FIG. 3 are elaborated in connection with the following figures.

Figure 4:
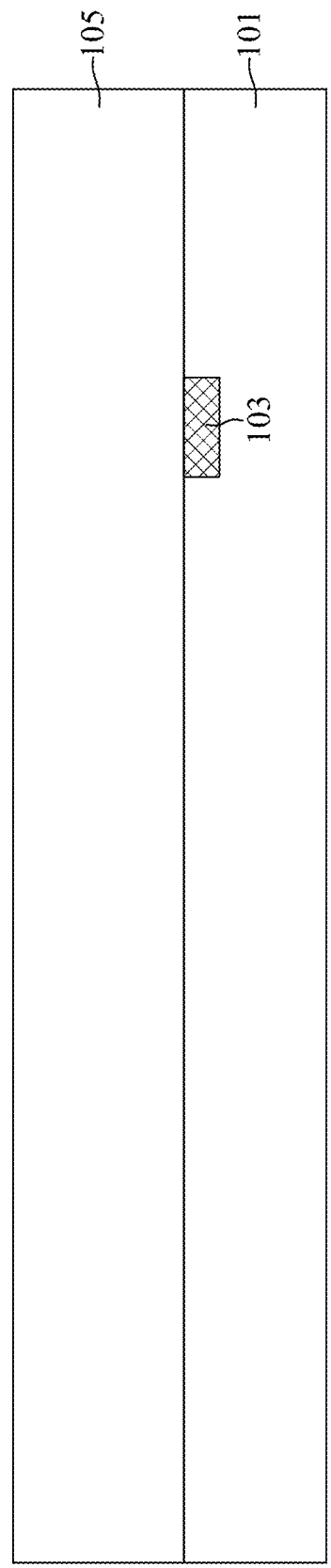
FIG. 4 is a cross-sectional view illustrating an intermediate stage of forming a dielectric layer over a semiconductor substrate during the formation of the semiconductor device, in accordance with some embodiments.

FIGS. 4 to 21 are cross-sectional views illustrating intermediate stages of forming the semiconductor device 100, in accordance with some embodiments. As shown in FIG. 4, the semiconductor substrate 101 with the conductive pad 103 is provided, and the dielectric layer 105 is formed over the semiconductor substrate 101, in accordance with some embodiments.

The semiconductor substrate 101 may be a portion of an integrated circuit (IC) chip that includes various passive and active microelectronic devices, such as resistors, capacitors, inductors, diodes, p-type field effect transistors (pFETs), n-type field effect transistors (nFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin field-effect transistors (FinFETs), other suitable IC components, or combinations thereof.

Depending on the IC fabrication stage, the semiconductor substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). For example, the conductive pad 103 close to the top surface of the semiconductor substrate 101 is electrically connected to the conductive layers in the semiconductor substrate 101. The semiconductor substrate 101 has been simplified for the sake of clarity. It should be noted that additional features can be added in the semiconductor substrate 101, and some of the features described below can be replaced, modified, or eliminated in other embodiments.

Moreover, the dielectric layer 105 is made of low-k dielectric materials. In some embodiments, the low-k dielectric materials have a dielectric constant (k value) less than about 4. Examples of the low-k dielectric materials include, but not limited to, silicon oxide, silicon nitride, silicon oxynitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide. In addition, the dielectric layer 105 may be formed by a deposition process. The deposition process may include a chemical vapor deposition (CVD) process, a physical vapor deposition (PVD) process, an atomic layer deposition (ALD) process, a spin-coating process, or another applicable process.

Figure 5:
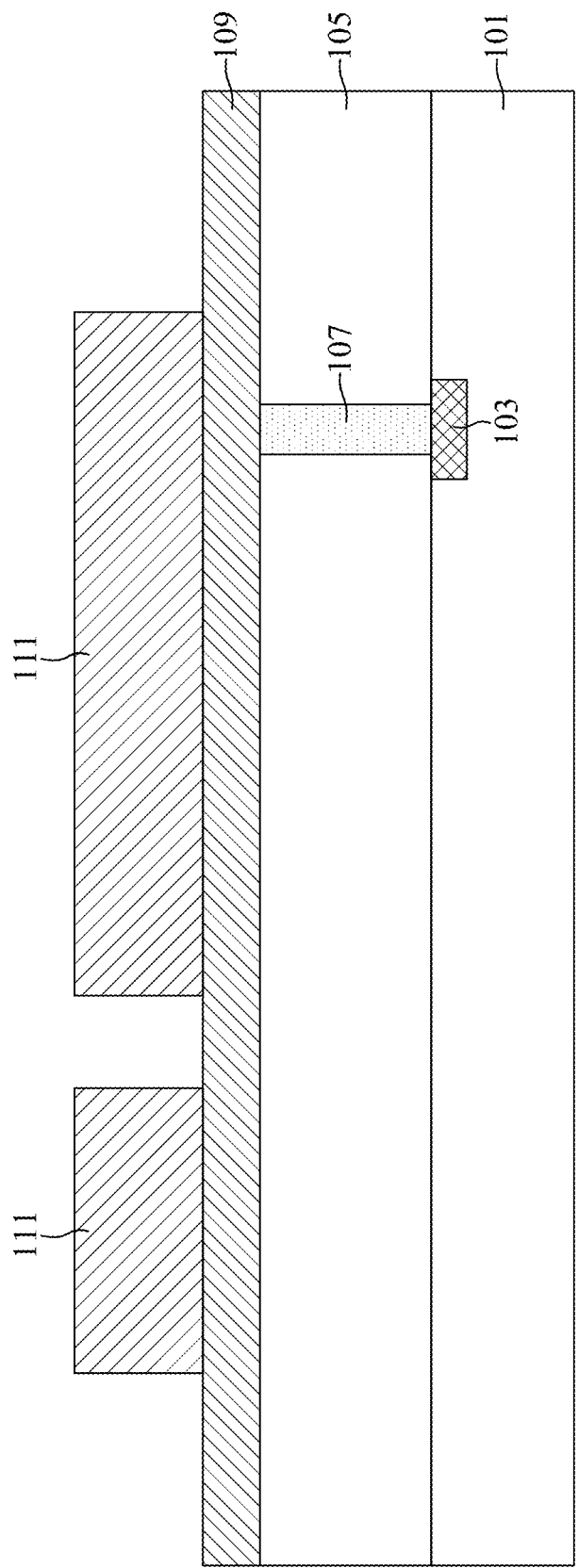
FIG. 5 is a cross-sectional view illustrating an intermediate stage of forming a conductive material over the dielectric layer during the formation of the semiconductor device, in accordance with some embodiments.

After the dielectric layer 105 is formed, the conductive plug 107 is formed penetrating through the dielectric layer 105 and physically contacting the conductive pad 103, as shown in FIG. 5 in accordance with some embodiments. In some embodiments, the conductive plug 107 is made of tungsten (W), aluminum (Al), copper (Cu), titanium (Ti), tantalum (Ta), a combination thereof, or another applicable metal material.

The formation of the conductive plug 107 may include partially removing the dielectric layer 105 to form an opening (not shown) by an etching process, and filling the opening with a conductive material (not shown) by a deposition process. The etching process may include a wet etching process, a dry etching process, or a combination thereof. The deposition process may include a CVD process, a PVD process, an ALD process, a metal organic chemical vapor deposition (MOCVD) process, a sputtering process, a plating process, a combination thereof, or another applicable process. After the deposition process, a planarization process may be performed to remove excess conductive material over the dielectric layer 105. The planarization process may include a chemical mechanical polishing (CMP) process, an etch-back process, a combination thereof, or another applicable process.

Still referring to FIG. 5, a conductive material 109 is formed over the dielectric layer 105 and covering the conductive plug 107, and a patterned mask 111 is formed over the conductive material 109, in accordance with some embodiments. Some materials used to form the conductive material 109 are similar to, or the same as those used to form the conductive plug 107, and details thereof are not repeated herein. The conductive material 109 may formed by a deposition process, such as a CVD process, a PVD process, an ALD process, an MOCVD process, a sputtering process, a plating process, or another applicable process.

Figure 6:
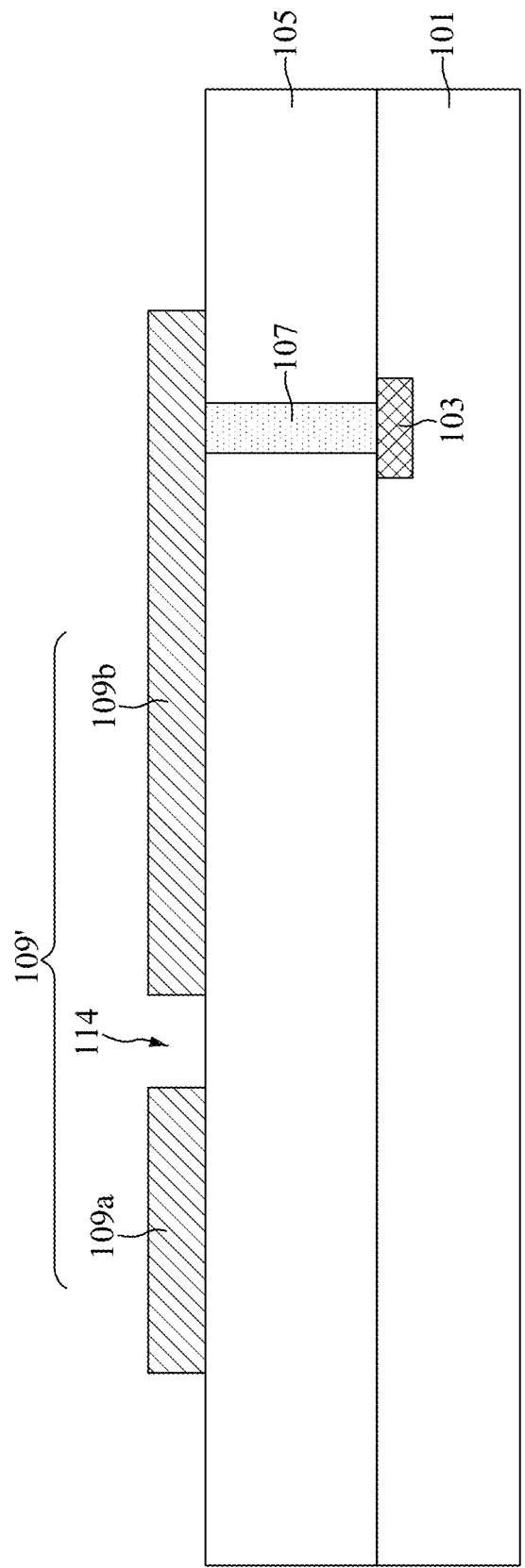
FIG. 6 is a cross-sectional view illustrating an intermediate stage of etching the conductive material to form conductive portions during the formation of the semiconductor device, in accordance with some embodiments.

Next, the conductive material 109 is etched to form the conductive structure 109' by using the patterned mask 111 as a mask, and the patterned mask 111 is removed after the conductive structure 109' is formed, as shown in FIG. 6 in accordance with some embodiments. The etching process may be a wet etching process, a dry etching process, or a combination thereof. In some embodiments, an opening 114 exposing the dielectric layer 105 is formed between the conductive portions 109a and 109b of the conductive structure 109' after the etching process. The respective step is illustrated as the step S11 in the method 10 shown in FIG. 3.

Figure 7:
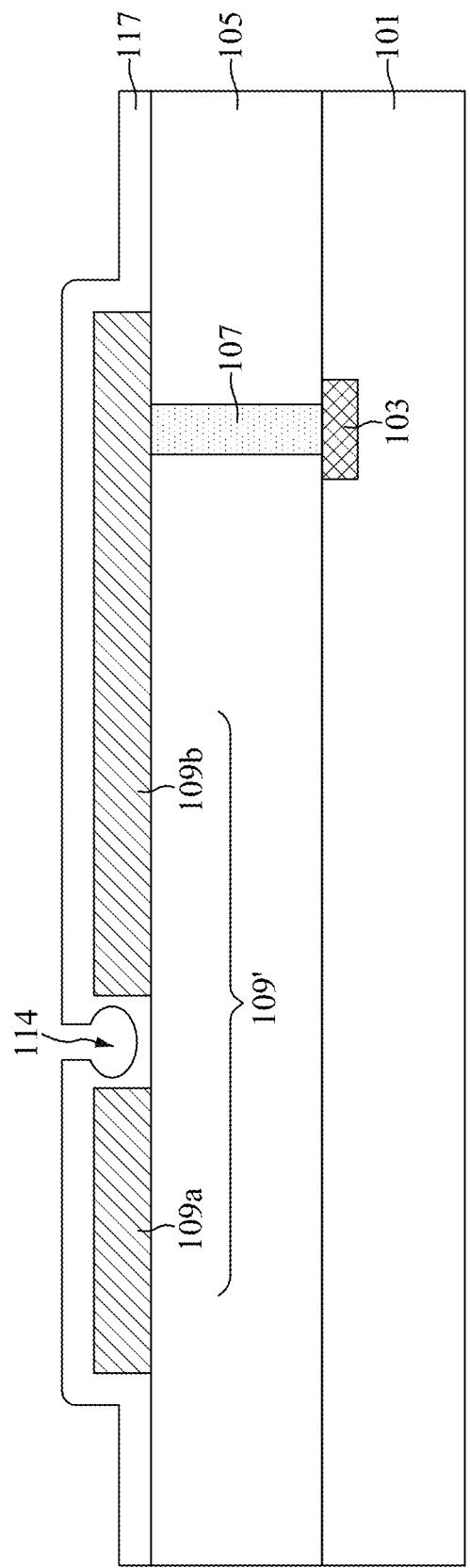
FIG. 7 is a cross-sectional view illustrating an intermediate stage of depositing a passivation layer to cover the conductive portions during the formation of the semiconductor device, in accordance with some embodiments.

After the conductive portions 109a and 109b are formed, the passivation layer 117 is deposited over the conductive portions 109a and 109b, as shown in FIG. 7 in accordance with some embodiments. In some embodiments, the sidewalls and the top surfaces of the conductive portions 109a and 109b are covered by the passivation layer 117. In some embodiments, the passivation layer 117 extends to cover the sidewalls and the bottom surface of the opening 114.

Moreover, the passivation layer 117 has neck portions located at the top portions of the opening 114. In some embodiments, the passivation layer 117 is made of silicon oxide, silicon carbide, silicon nitride, silicon oxynitride, another applicable material, or a combination thereof, and the passivation layer 117 is formed by a CVD process, a plasma-enhanced chemical vapor deposition (PECVD) process, or another applicable process. The respective step is illustrated as the step S13 in the method 10 shown in FIG. 3.

Figure 8:
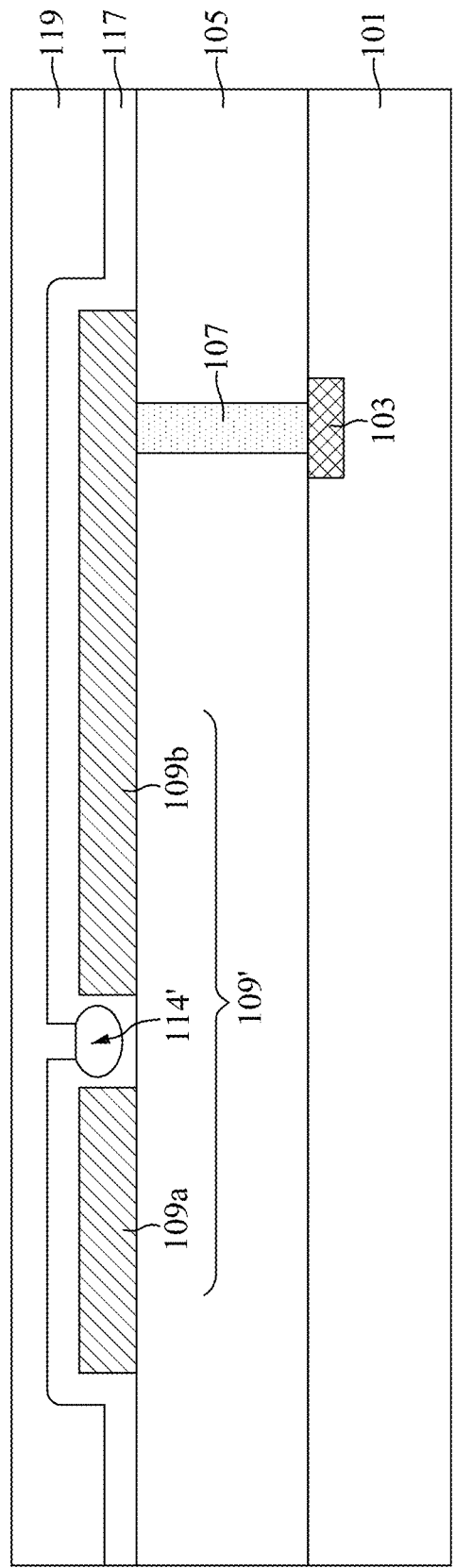
FIG. 8 is a cross-sectional view illustrating an intermediate stage of depositing a dielectric layer over the passivation layer during the formation of the semiconductor device, in accordance with some embodiments.

Subsequently, the dielectric layer 119 is formed over the passivation layer 117, as shown in FIG. 8 in accordance with some embodiments. In some embodiments, the dielectric layer 119 extends to fill the upper portion of the opening 114, and the lower portion of the opening 114 is not filled, such that the remaining portion of the opening 114' (i.e., the air gap 114') is enclosed by the dielectric layer 119 and the passivation layer 117. Some materials and processes used to form the dielectric layer 119 are similar to, or the same as those used to form the passivation layer 117, and details thereof are not repeated herein.

In some embodiments, the conductive portions 109a and 109b, the portion of the passivation layer 117 between the conductive portions 109a and 109b, and the air gap 114' form the anti-fuse 180 (as shown in FIG. 1). In some other embodiments, the opening 114 is entirely filled by the dielectric layer 119. Therefore, the air gap 114' is not formed. In these cases, the conductive portions 109a and 109b, and the portion of the passivation layer 117 between the conductive portions 109a and 109b form the anti-fuse. The respective step is illustrated as the step S15 in the method 10 shown in FIG. 3.

Figure 9:
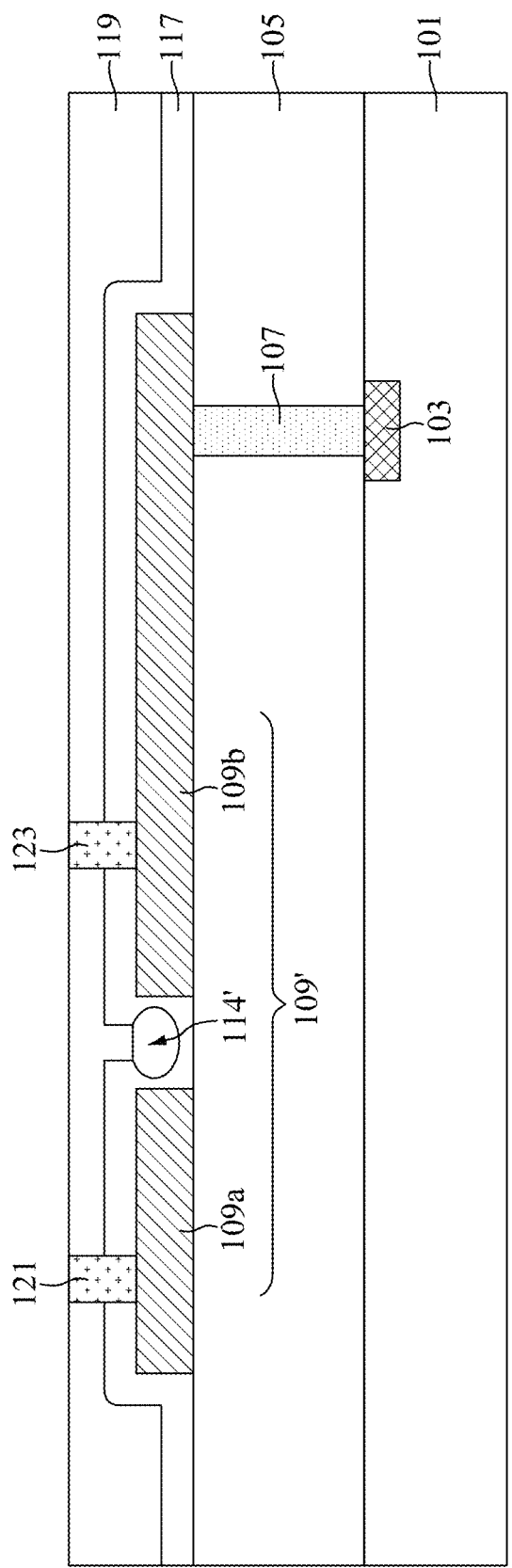
FIG. 9 is a cross-sectional view illustrating an intermediate stage of forming conductive plugs over the conductive portions during the formation of the semiconductor device, in accordance with some embodiments.

Then, the conductive plug 121 is formed over the conductive portion 109a, and the conductive plug 123 is formed over the conductive portion 109b, as shown in FIG. 9 in accordance with some embodiments. In some embodiments, the conductive plugs 121 and 123 penetrate through the dielectric layer 119 and the passivation layer 117 to physically contact the conductive portions 109a and 109b. Some materials and processes used to form the conductive plugs 121 and 123 are similar to, or the same as those used to form the conductive plug 107, and details thereof are not repeated herein.

Figure 10:
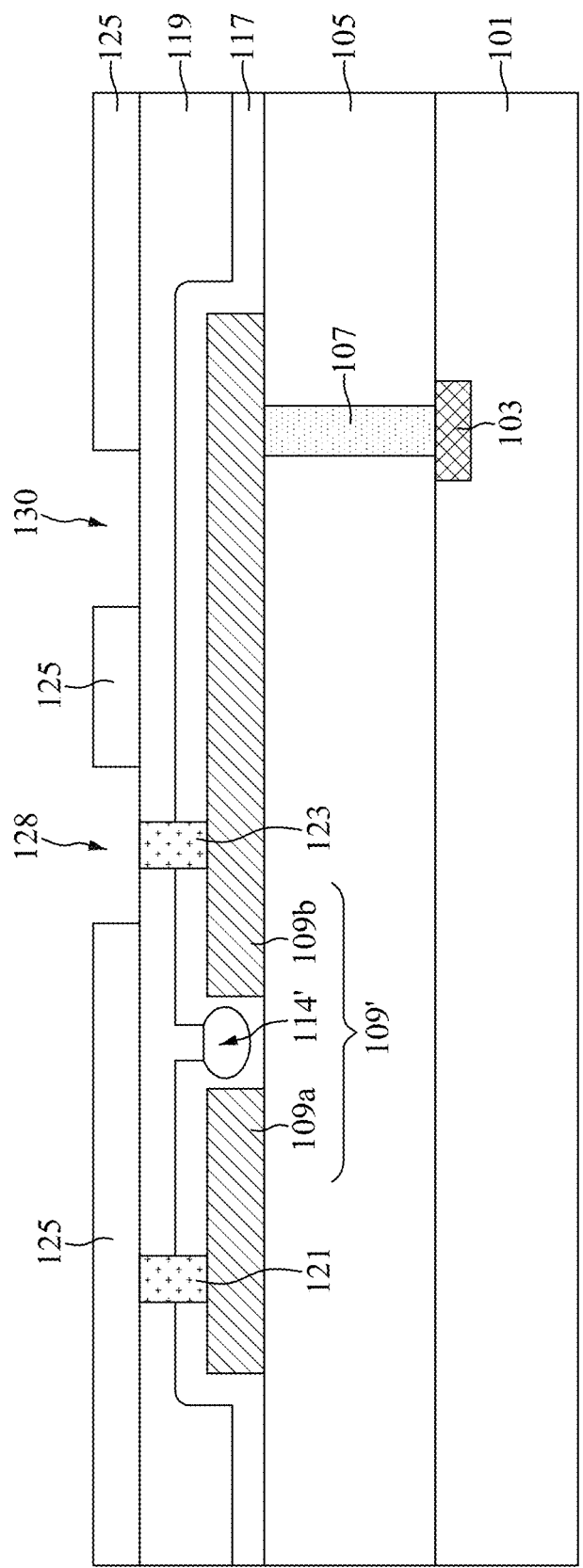
FIG. 10 is a cross-sectional view illustrating an intermediate stage of forming a dielectric layer with openings over the conductive plugs during the formation of the semiconductor device, in accordance with some embodiments.

After the conductive plugs 121 and 123 are formed, a dielectric layer 125 is formed over the dielectric layer 119, and the dielectric layer 125 is partially removed to form openings 128 and 130 by an etching process, as shown in FIG. 10 in accordance with some embodiments. In some embodiments, the conductive plug 123 and portions of the dielectric layer 119 are exposed by the openings 128 and 130. Some materials and processes used to form the dielectric layer 125 are similar to, or the same as those used to form the passivation layer 117, and details thereof are not repeated herein.

For example, a patterned mask (not shown) may be formed over the dielectric layer 125, and an etching process may be performed on the dielectric layer 125 to form the openings 128 and 130 by using the patterned mask as a mask. The etching process may include a wet etching process, a dry etching process, or a combination thereof. After the openings 128 and 130 are formed, the patterned mask may be removed.

Figure 11:
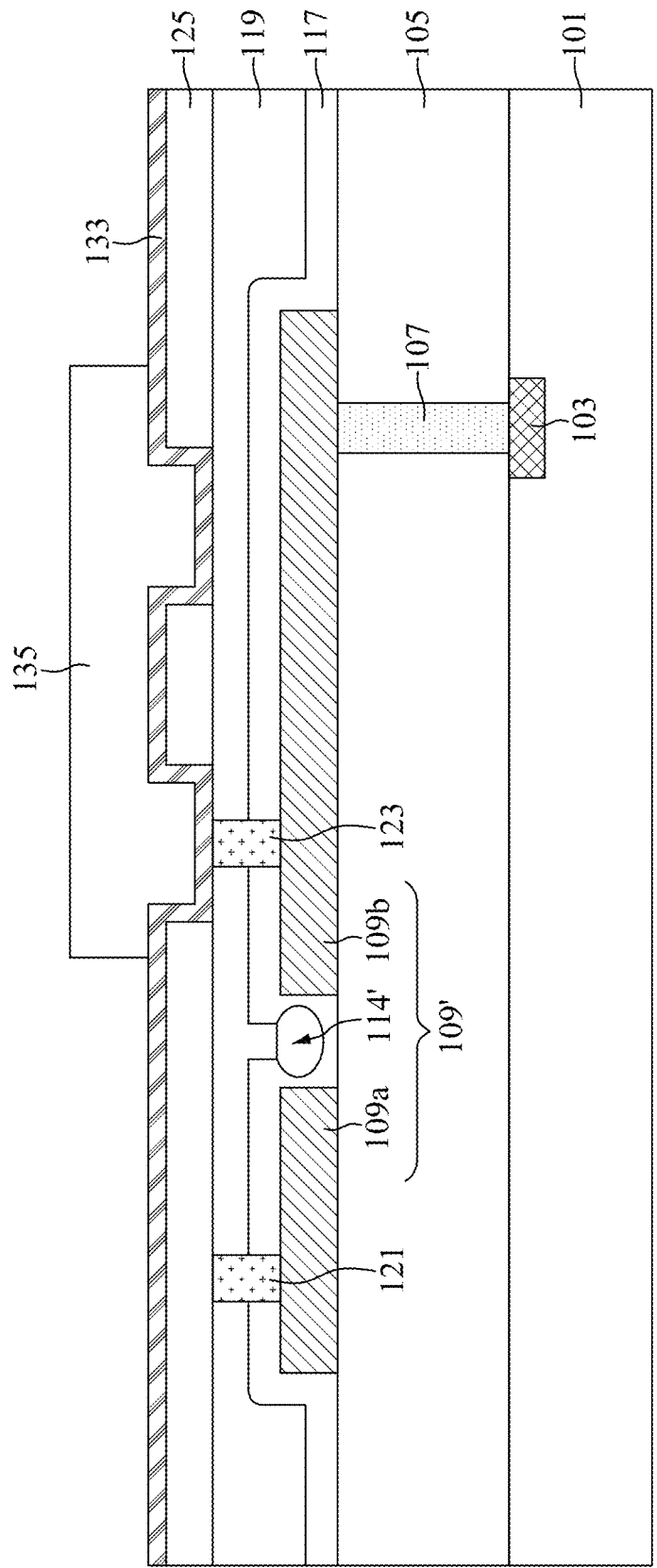
FIG. 11 is a cross-sectional view illustrating an intermediate stage of forming a metal material over the dielectric layer and extending into the openings during the formation of the semiconductor device, in accordance with some embodiments.

Next, a metal material 133 is formed over the dielectric layer 125, and a patterned mask 135 is formed over the metal material 133, as shown in FIG. 11 in accordance with some embodiments. In some embodiments, the metal material 133 covers the top surface of the dielectric layer 125 and extends into the openings 128 and 130 of FIG. 10. Specifically, the sidewalls and the bottom surfaces of the openings 128 and 130 are covered by the metal material 133. In some embodiments, the metal material 133 physically contacts the conductive plug 123 and the exposed portions of the dielectric layer 119.

It should be noted that the openings 128 and 130 are not entirely filled by the metal material 133. In some embodiments, the metal material 133 is conformally deposited over the structure of FIG. 10, and the remaining portions of the openings 128 and 130 are filled by the patterned mask 135. Some materials and processes used to form the metal material 133 are similar to, or the same as those used to form the conductive material 109 of FIG. 5, and details thereof are not repeated herein. In some embodiments, the metal material 133 is made of titanium nitride (TiN).

Figure 12:
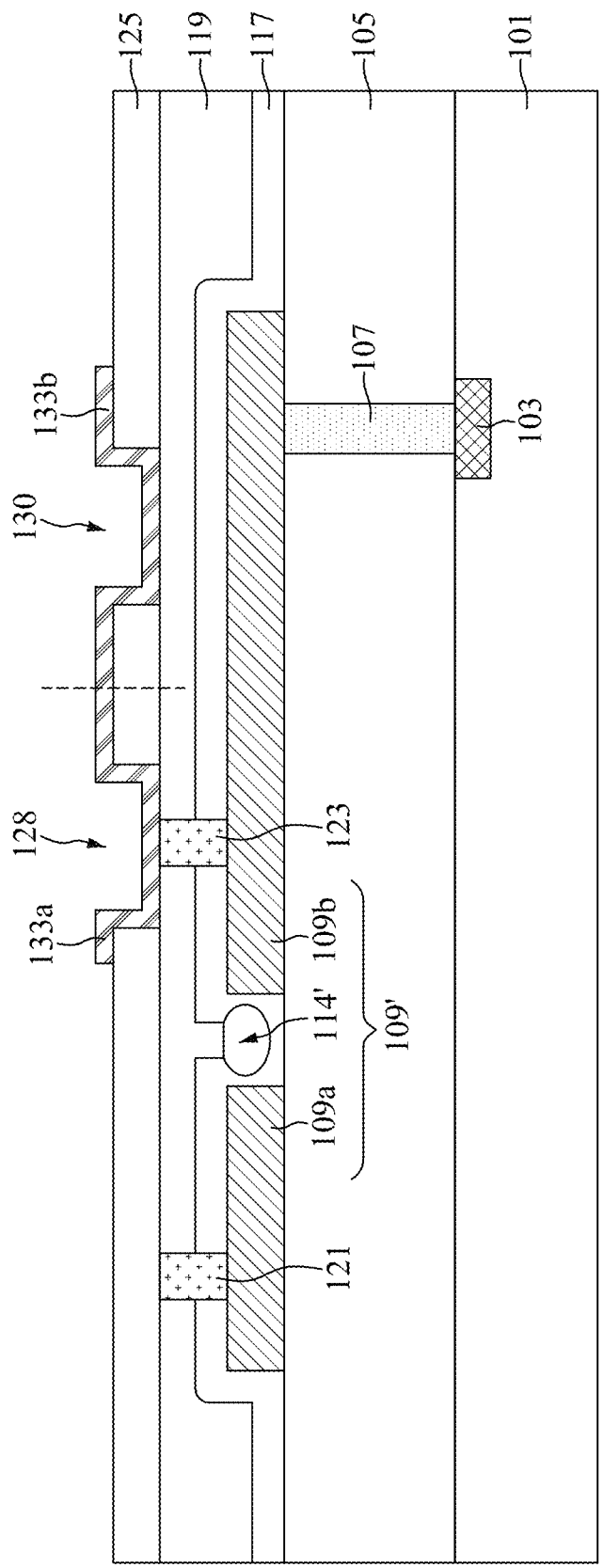
FIG. 12 is a cross-sectional view illustrating an intermediate stage of etching the metal material to form a metal layer and a redistribution layer during the formation of the semiconductor device, in accordance with some embodiments.

Subsequently, the metal material 133 is etched to form the metal layer 133a and the RDL 133b by using the patterned mask 135 as a mask, and the patterned mask 135 is removed after the metal layer 133a and the RDL 133b are formed, as shown in FIG. 12 in accordance with some embodiments. The etching process may be a wet etching process, a dry etching process, or a combination thereof. The respective step is illustrated as the step S17 in the method 10 shown in FIG. 3.

In some embodiments, the dashed line indicating the boundary of the metal layer 133a and the RDL 133b is used to clarify the disclosure. No obvious interfaces exist between the metal layer 133a and the RDL 133b. It should be noted that, the metal layer 133a and the RDL 133b are made of the same material and are formed simultaneously from the same material layer (i.e., the metal material 133), in accordance with some embodiments. In some embodiments, the metal layer 133a and the RDL 133b are integrally formed. In some embodiments, the metal layer 133a is physically connected to the RDL 133b. In some embodiments, the metal layer 133a and the RDL 133b form a continuous layer.

Figure 13:
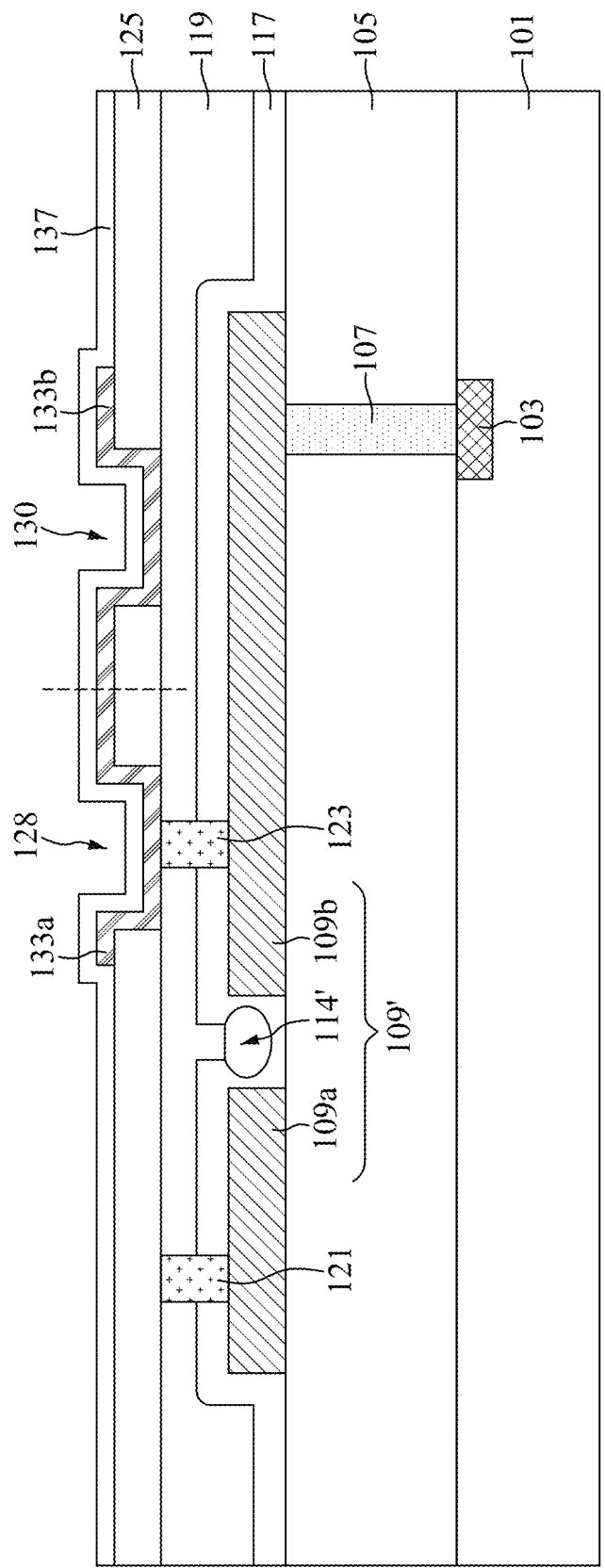
FIG. 13 is a cross-sectional view illustrating an intermediate stage of forming an insulating layer over the metal layer and the redistribution layer during the formation of the semiconductor device, in accordance with some embodiments.

After the metal layer 133a and the RDL 133b are formed, the insulating layer 137 is formed over the metal layer 133a, the RDL 133b and the dielectric layer 125, as shown in FIG. 13 in accordance with some embodiments. In some embodiments, the insulating layer 137 is conformally deposited over the structure of FIG. 12. It should be noted that the openings 128 and 130 of FIG. 12 are not entirely filled by the insulating layer 137.

In some embodiments, the insulating layer 137 is made of a dielectric material, such as silicon dioxide ($SiO_2$), hafnium dioxide ($HfO_2$), aluminum oxide ($Al_2O_3$), zirconium dioxide ($ZrO_2$), or a combination thereof. The insulating layer 137 may be formed by a CVD process, a PVD process, an ALD process, a spin-coating process, or another applicable process. The respective step is illustrated as the step S19 in the method 10 shown in FIG. 3.

Figure 14:
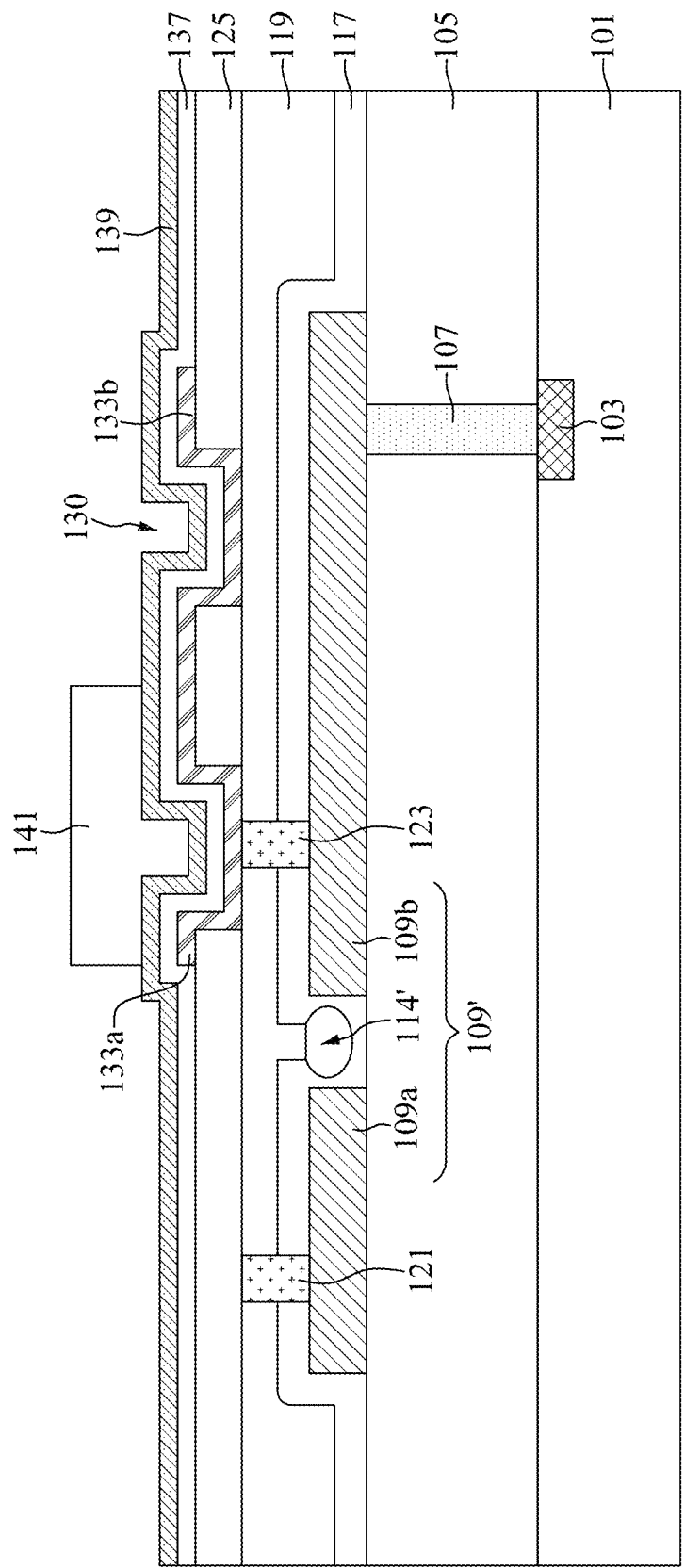
FIG. 14 is a cross-sectional view illustrating an intermediate stage of forming a metal material over the insulating layer during the formation of the semiconductor device, in accordance with some embodiments.

Next, a metal material 139 is formed over the insulating layer 137, and a patterned mask 141 is formed over the metal material 139, as shown in FIG. 14 in accordance with some embodiments. In some embodiments, the metal material 139 covers the top surface of the insulating layer 137 and extends into the openings 128 and 130 of FIG. 13. It should be noted that the openings 128 and 130 of FIG. 13 are not entirely filled by the metal material 139.

In some embodiments, the metal material 139 is conformally deposited over the structure of FIG. 13, and the remaining portion of the opening 128 is filled by the patterned mask 141. Some materials and processes used to form the metal material 139 are similar to, or the same as those used to form the conductive material 109 of FIG. 5, and details thereof are not repeated herein. In some embodiments, the metal material 139 is made of titanium nitride (TiN), low-stress silicon-germanium (SiGe), or a combination thereof.

Figure 15:
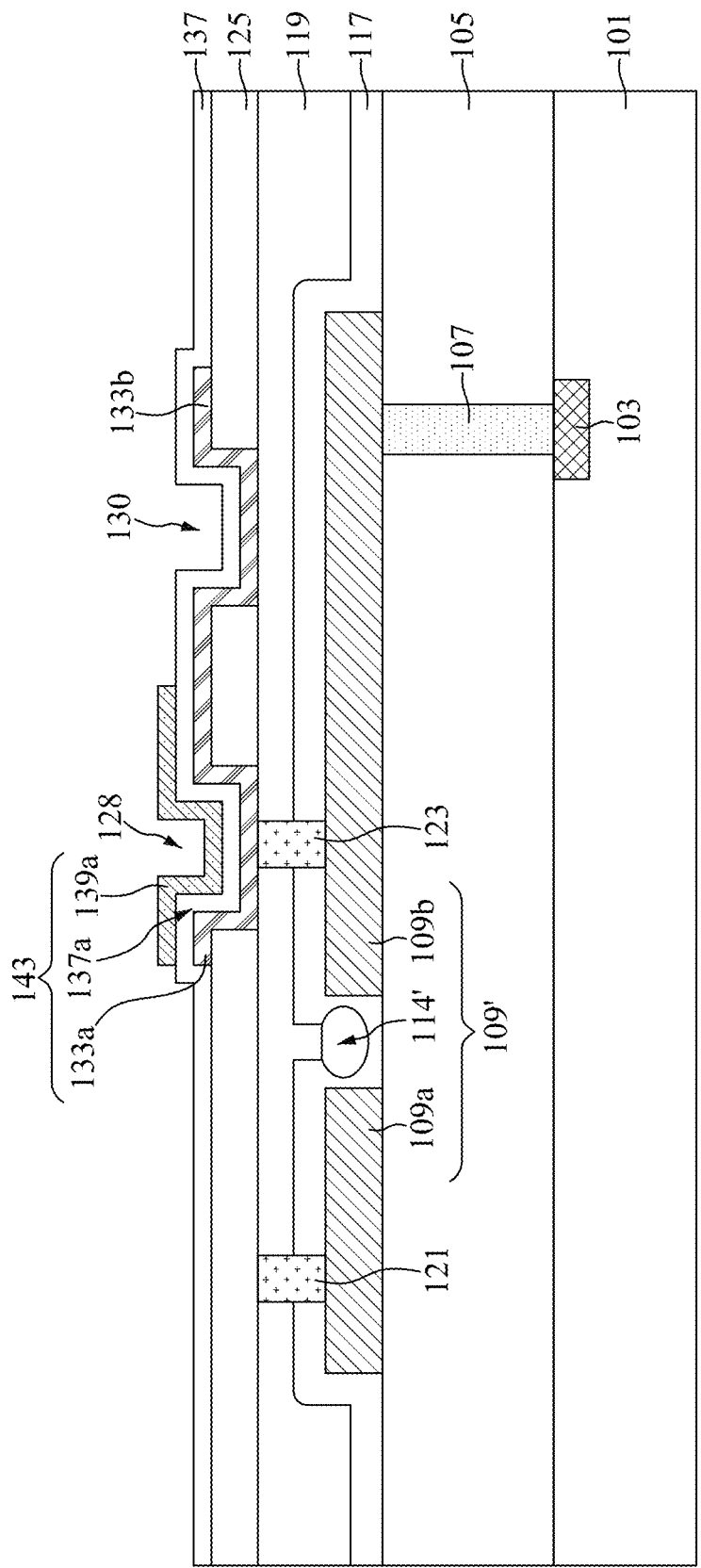
FIG. 15 is a cross-sectional view illustrating an intermediate stage of etching the metal material to form a metal layer over the insulating layer during the formation of the semiconductor device, in accordance with some embodiments.

Subsequently, the metal material 139 is etched to form the metal layer 139a by using the patterned mask 141 as a mask, and the patterned mask 141 is removed after the metal layer 139a is formed, as shown in FIG. 15 in accordance with some embodiments. The etching process may be a wet etching process, a dry etching process, or a combination thereof. After the metal layer 139a is formed, the MIM capacitor 143 is obtained.

As mentioned above, the MIM capacitor 143 includes the metal layer 133a, the metal layer 139a, and the portion 137a of the insulating layer 137 sandwiched between the metal layers 133a and 139a. The respective step is illustrated as the step S21 in the method 10 shown in FIG. 3. In some embodiments, the RDL 133b is electrically connected to the conductive portion 109b through the MIM capacitor 143 and the conductive plug 123. Since the metal layer 133a of the MIM capacitor 143 and the RDL 133b are formed as a complete, continuous layer, the manufacturing cost may be reduced, and the overall size of the device may be reduced.

In some other embodiments, the RDL 133b is integrally formed with the metal layer 139a of the MIM capacitor 143 instead of the metal layer 133a of the MIM capacitor 143. In these cases, the RDL 133b is physically connected to the metal layer 139a, and the metal layer 133a does not extend underlying the RDL 133b. That is, the RDL 133b and the metal layer 139a are formed as a continuous layer in these cases.

Figure 16:
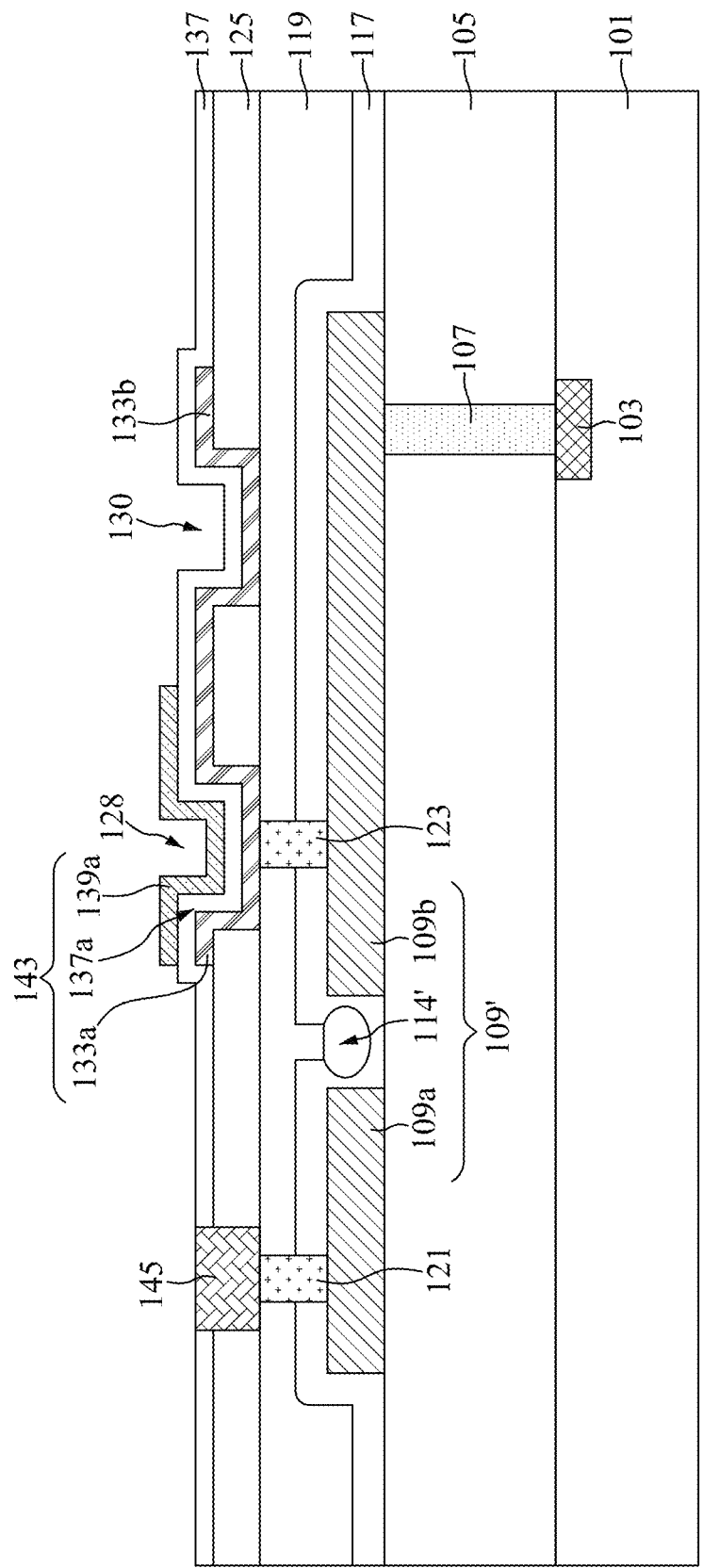
FIG. 16 is a cross-sectional view illustrating an intermediate stage of forming a conductive layer over one of the conductive plugs during the formation of the semiconductor device, in accordance with some embodiments.

After the MIM capacitor 143 is formed, the conductive layer 145 is formed directly over and in physical contact with the conductive plug 121, as shown in FIG. 16 in accordance with some embodiments. In some embodiments, the conductive layer 145 penetrates through the dielectric layer 125 and the insulating layer 137. Some materials used to form the conductive layer 145 are similar to, or the same as those used to form the conductive plug 107, and details thereof are not repeated herein.

Figure 17:
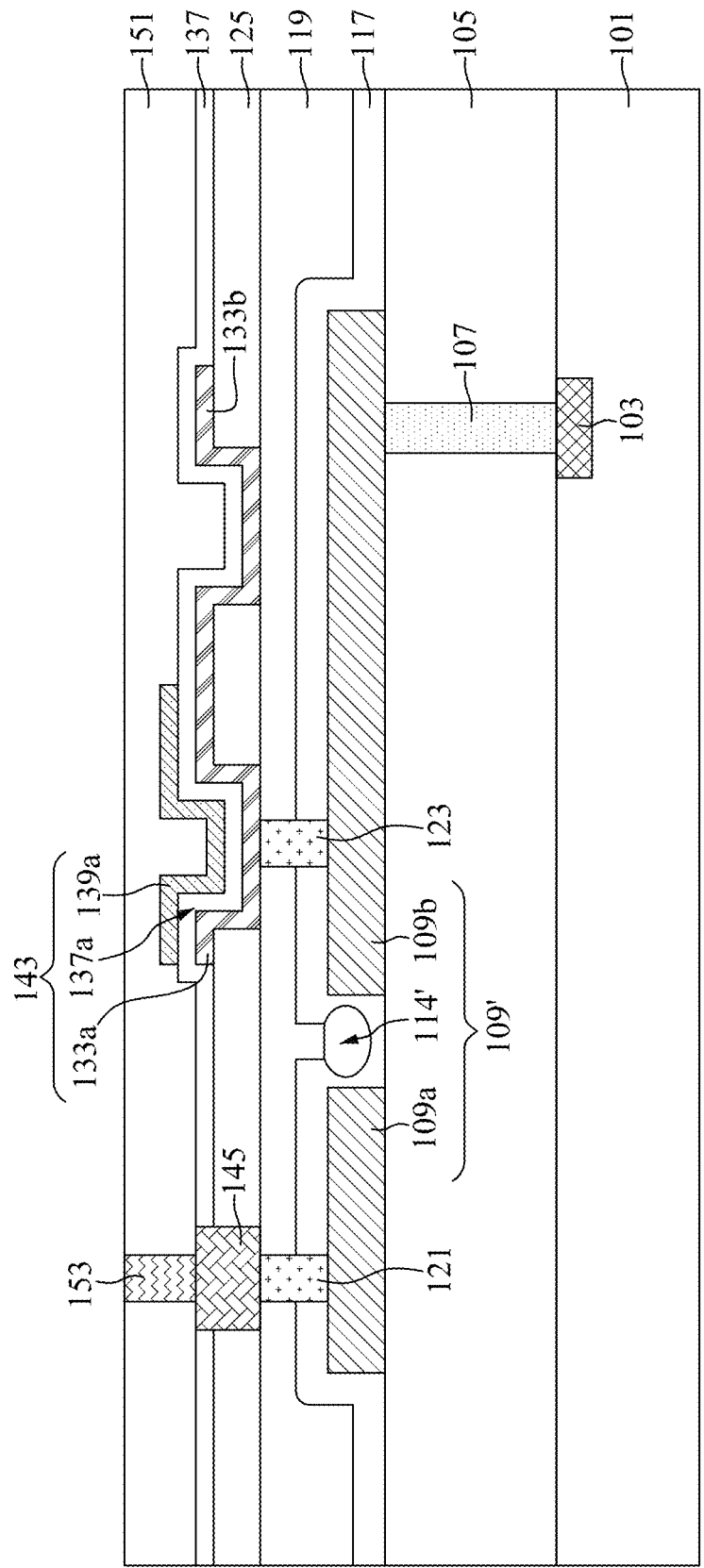
FIG. 17 is a cross-sectional view illustrating an intermediate stage of forming a conductive plug over the conductive layer during the formation of the semiconductor device, in accordance with some embodiments.

Next, the dielectric layer 151 is formed over the metal layer 139a of the IM capacitor 143, the insulating layer 137 and the conductive layer 145, and the conductive plug 153 is formed directly over and in physical contact with the conductive layer 145, as shown in FIG. 17 in accordance with some embodiments. In some embodiments, the MIM capacitor 143 and the RDL 133b are covered by the dielectric layer 151. In some embodiments, the top surface of the conductive plug 153 is higher than the top surface of the metal layer 139a of the MIM capacitor 143.

In some embodiments, the dielectric layer 151 is made of silicon oxide, silicon nitride, silicon oxynitride, another applicable material, or a combination thereof. The dielectric layer 151 may be formed by a CVD process, a PVD process, a spin-coating process, or another applicable process. In addition, some materials and processes used to form the conductive plug 153 are similar to, or the same as those used to form the conductive plug 107, and details thereof are not repeated herein.

Figure 18:
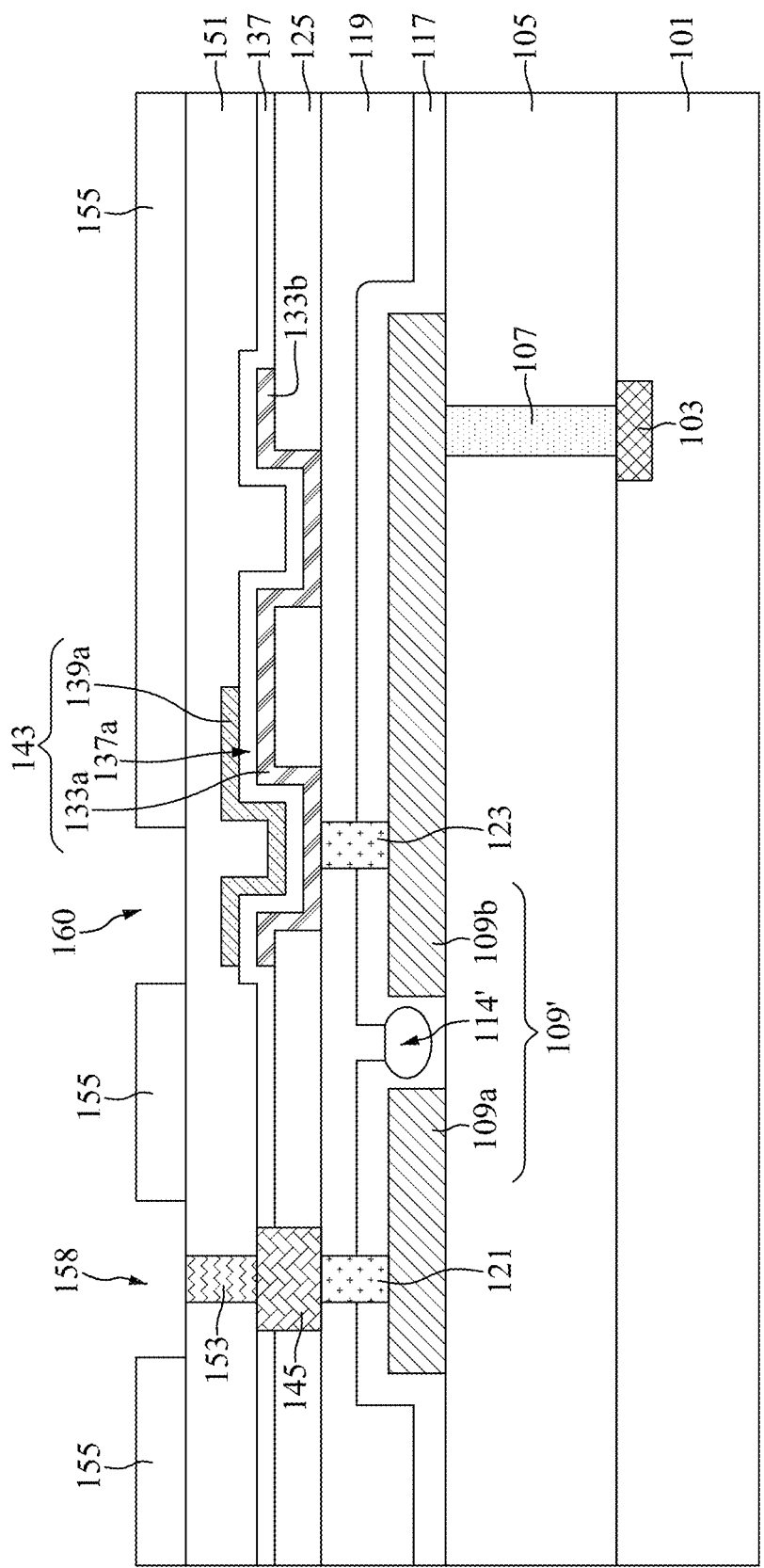
FIG. 18 is a cross-sectional view illustrating an intermediate stage of forming a dielectric layer with openings over the conductive plug during the formation of the semiconductor device, in accordance with some embodiments.

After the conductive plug 153 is formed, a dielectric layer 155 is formed over the dielectric layer 151, and the dielectric layer 155 is partially removed to form openings 158 and 160 by an etching process, as shown in FIG. 18 in accordance with some embodiments. In some embodiments, the conductive plug 153 and portions of the dielectric layer 151 are exposed by the openings 158 and 160. Some materials and processes used to form the dielectric layer 155 are similar to, or the same as those used to form the passivation layer 117, and details thereof are not repeated herein.

For example, a patterned mask (not shown) may be formed over the dielectric layer 155, and an etching process may be performed on the dielectric layer 155 to form the openings 158 and 160 by using the patterned mask as a mask. The etching process may include a wet etching process, a dry etching process, or a combination thereof. After the openings 158 and 160 are formed, the patterned mask may be removed.

Figure 19:
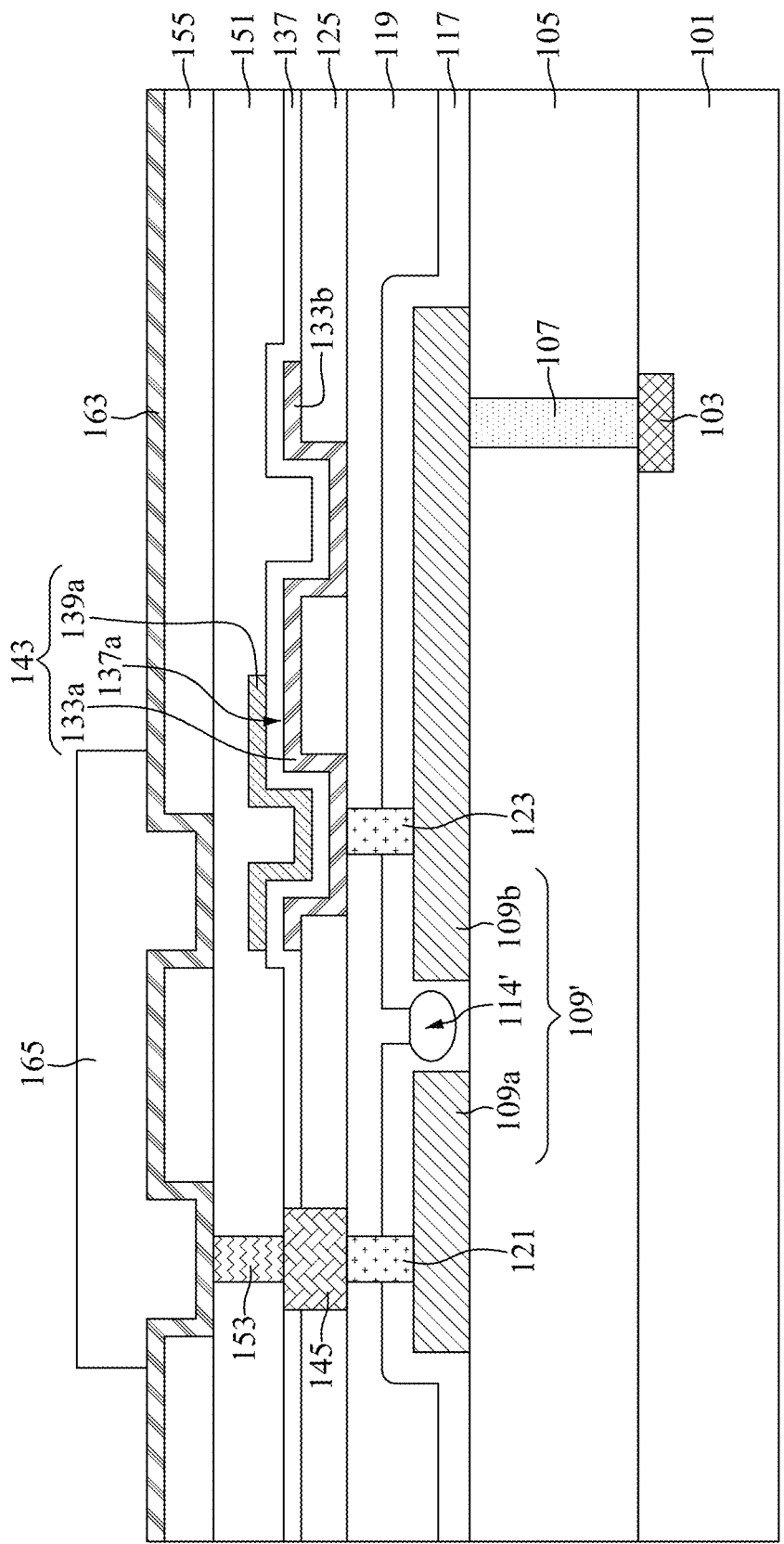
FIG. 19 is a cross-sectional view illustrating an intermediate stage of forming a metal material over the dielectric layer and extending into the openings during the formation of the semiconductor device, in accordance with some embodiments.

Then, a metal material 163 is formed over the dielectric layer 155, and a patterned mask 165 is formed over the metal material 163, as shown in FIG. 19 in accordance with some embodiments. In some embodiments, the metal material 163 covers the top surface of the dielectric layer 155 and extends into the openings 158 and 160 of FIG. 18. Specifically, the sidewalls and the bottom surfaces of the openings 158 and 160 are covered by the metal material 163. In some embodiments, the metal material 163 physically contacts the conductive plug 153 and the exposed portions of the dielectric layer 151.

It should be noted that the openings 158 and 160 are not entirely filled by the metal material 163. In some embodiments, the metal material 163 is conformally deposited over the structure of FIG. 18, and the remaining portions of the openings 158 and 160 are filled by the patterned mask 165. Some materials and processes used to form the metal material 163 are similar to, or the same as those used to form the metal material 133 of FIG. 11, and details thereof are not repeated herein.

Figure 20:
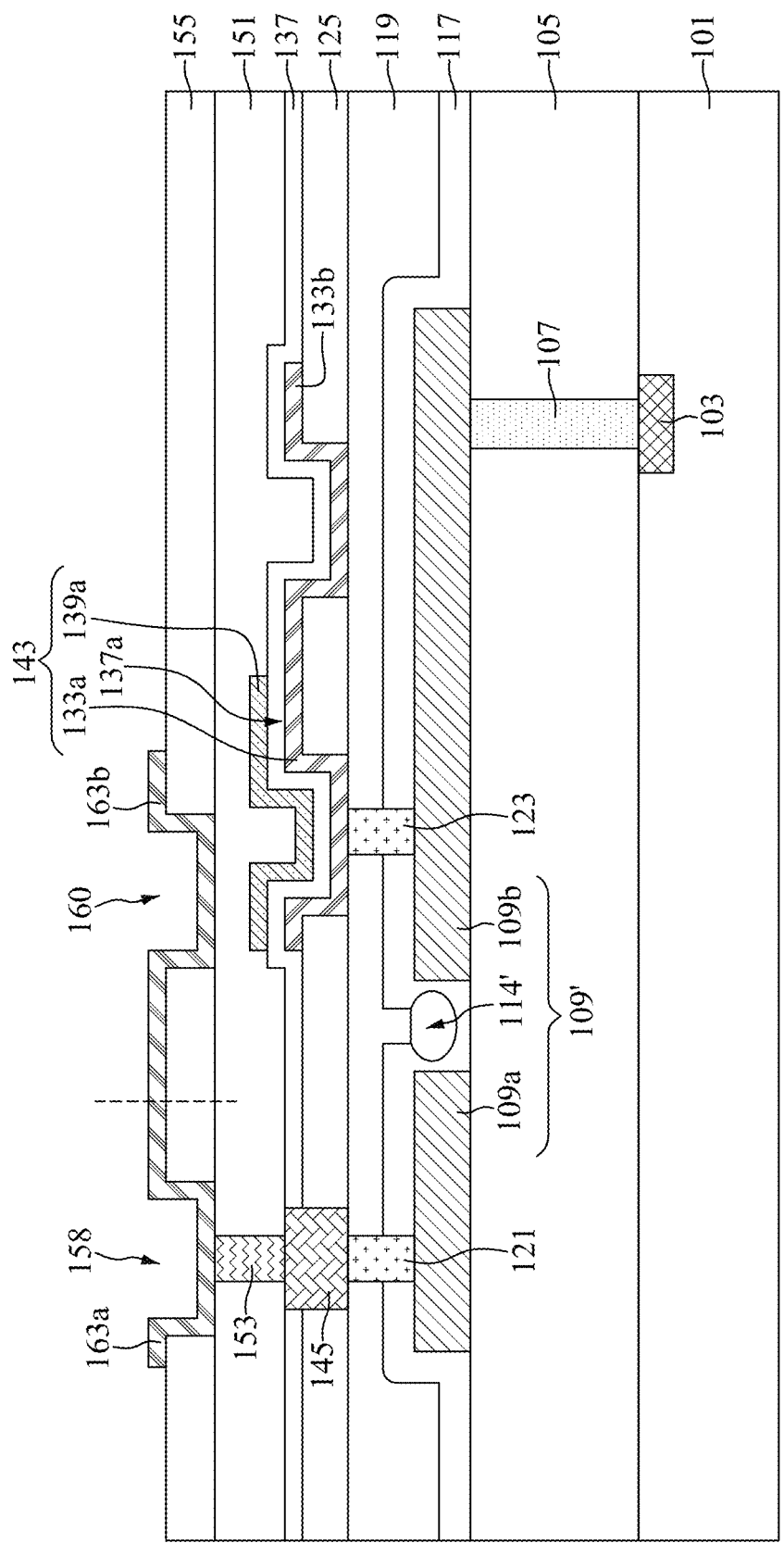
FIG. 20 is a cross-sectional view illustrating an intermediate stage of etching the metal material to form a metal layer and a redistribution layer during the formation of the semiconductor device, in accordance with some embodiments.

Next, the metal material 163 is etched to form the metal layer 163a and the RDL 163b by using the patterned mask 165 as a mask, and the patterned mask 165 is removed after the metal layer 163a and the RDL 163b are formed, as shown in FIG. 20 in accordance with some embodiments. The etching process may be a wet etching process, a dry etching process, or a combination thereof.

Similar to the dashed line between the metal layer 133a and the RDL 133b of FIG. 12, the dashed line of FIG. 20 indicating the boundary of the metal layer 163a and the RDL 163b is used to clarify the disclosure. No obvious interfaces exist between the metal layer 163a and the RDL 163b. It should be noted that, the metal layer 163a and the RDL 163b are made of the same material and are formed simultaneously from the same material layer (i.e., the metal material 133), in accordance with some embodiments. In some embodiments, the metal layer 163a and the RDL 163b are integrally formed. In some embodiments, the metal layer 163a is physically connected to the RDL 163b. In some embodiments, the metal layer 163a and the RDL 163b form a continuous layer.

Figure 21:
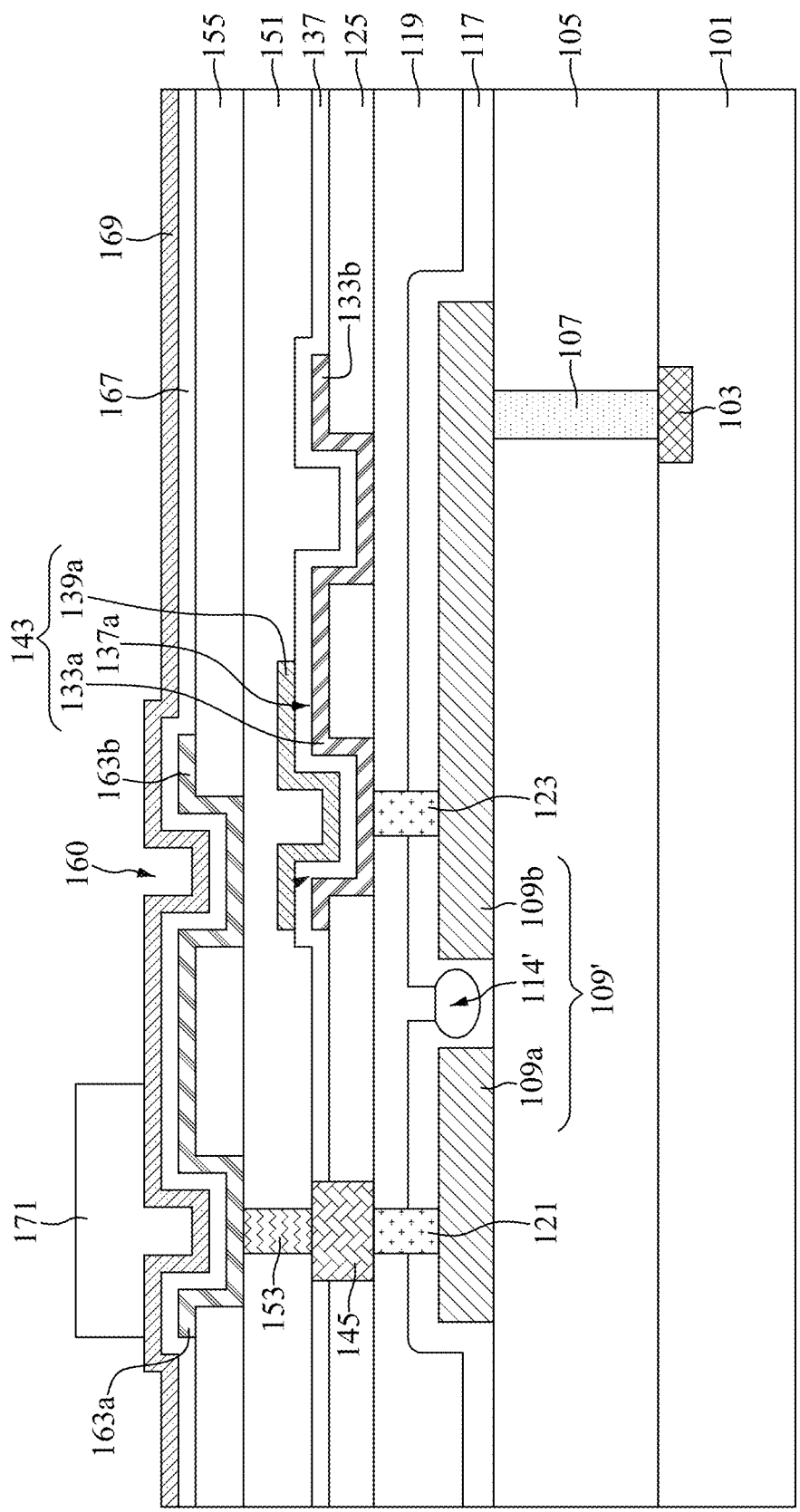
FIG. 21 is a cross-sectional view illustrating an intermediate stage of forming an insulating layer over the metal layer and the redistribution layer and forming a metal material over the insulating layer during the formation of the semiconductor device, in accordance with some embodiments.

After the metal layer 163a and the RDL 163b are formed, the insulating layer 167 and a metal material 169 are sequentially formed over the structure of FIG. 20, and a patterned mask 171 is formed over the metal material 169, as shown in FIG. 21 in accordance with some embodiments. In some embodiments, the insulating layer 137 and the metal material 169 are conformally deposited over the structure of FIG. 20. It should be noted that the openings 158 and 160 of FIG. 20 are not entirely filled by the insulating layer 167 and the metal material 169, and the remaining portion of the opening 168 is filled by the patterned mask 171. Some materials and processes used to form the insulating layer 167 and the metal material 169 are similar to, or the same as those used to form the insulating layer 137 of FIG. 13 and the metal material 139 of FIG. 14, respectively, and details thereof are not repeated herein.

Referring back to FIG. 1, after the patterned mask 171 is formed, the metal material 169 is etched to form the metal layer 169a by using the patterned mask 171 as a mask, and the patterned mask 171 is removed after the metal layer 169a is formed, in accordance with some embodiments. The etching process may be a wet etching process, a dry etching process, or a combination thereof. After the metal layer 169a is formed, the MIM capacitor 173 is obtained.

As mentioned above, the MIM capacitor 173 includes the metal layer 163a, the metal layer 169a, and the portion 167a of the insulating layer 167 sandwiched between the metal layers 163a and 169a. In some embodiments, the RDL 163b is electrically connected to the conductive portion 109a through the MIM capacitor 173, the conductive plug 153, the conductive layer 145 and the conductive plug 121. Since the metal layer 163a of the MIM capacitor 173 and the RDL 163b are formed as a complete, continuous layer, the manufacturing cost may be reduced, and the overall size of the semiconductor device 100 may be reduced.

In some other embodiments, the RDL 163b is integrally formed with the metal layer 169a of the MIM capacitor 173 instead of the metal layer 163a of the MIM capacitor 173. In these cases, the RDL 163b is physically connected to the metal layer 169a, and the metal layer 163a does not extend underlying the RDL 163b. That is, the RDL 163b and the metal layer 169a are formed as a continuous layer in these cases.

Embodiments of the semiconductor device 100 are provided in the disclosure. In some embodiments, the semiconductor device 100 includes the anti-fuse 180, the MIM capacitor 143 (the first MIM capacitor), the MIM capacitor 173 (the second MIM capacitor), the RDL 133b (the first RDL) and the RDL 163b (the second RDL). In some embodiments, the anti-fuse 180 is formed by the conductive portion 109b (the first conductive portion), the conductive portion 109a (the second conductive portion), and the portion of the passivation layer 117 between the conductive portions 109b and 109a. In some embodiments, the anti-fuse 180 includes the air gap 114' surrounded by the portion of the passivation layer 117 between the conductive portions 109b and 109a. Moreover, the MIM capacitor 143 and the RDL 133b are disposed over and electrically connected to the conductive portion 109b, and a metal layer of the MIM capacitor 143 (e.g., the metal layer 133a) is integrally formed with the RDL 133b. In addition, the MIM capacitor 173 and the RDL 163b are disposed over and electrically connected to the conductive portion 109a, and a metal layer of the MIM capacitor 173 (e.g., the metal layer 163b) is integrally formed with the RDL 163b. As a result, the integration of the semiconductor device 100 may be increased, and the overall size of the semiconductor device 100 may be reduced. In addition, the manufacturing cost of the semiconductor device 100 may be reduced.

In one embodiment of the present disclosure, a semiconductor device is provided. The semiconductor device includes a first conductive portion and a second conductive portion disposed over a semiconductor substrate. The semiconductor device also includes a passivation layer covering the first conductive portion and the second conductive portion. The first conductive portion, the second conductive portion and a portion of the passivation layer therebetween form an anti-fuse. The semiconductor device further includes a first metal-insulator-metal (MIM) capacitor and a first redistribution layer (RDL) disposed over the passivation layer. The first MIM capacitor and the first RDL are electrically connected to the first conductive portion, and a first metal layer of the first MIM capacitor is integrally formed with the first RDL.

In another embodiment of the present disclosure, a semiconductor device is provided. The semiconductor device includes a first conductive portion and a second conductive portion disposed over a semiconductor substrate, and a passivation layer covering the first conductive portion and the second conductive portion. The semiconductor device also includes a first conductive plug penetrating through the passivation layer and contacting the first conductive portion, and a second conductive plug penetrating through the passivation layer and contacting the second conductive portion. The semiconductor device further includes an anti-fuse disposed between the first conductive plug and the second conductive plug, and a first metal-insulator-metal (MIM) capacitor disposed over the first conductive plug. In addition, the semiconductor device includes a first redistribution layer (RDL) physically connecting a first metal layer of the first MIM capacitor. The first RDL is electrically connected to the first conductive portion through the first metal layer of the first MIM capacitor and the first conductive plug.

In yet another embodiment of the present disclosure, a method for forming a semiconductor device is provided. The method includes forming a first conductive portion and a second conductive portion over a semiconductor substrate, and depositing a passivation layer over the first conductive portion and the second conductive portion. An opening is formed over the passivation layer and between the first conductive portion and the second conductive portion. The method also includes depositing a first dielectric layer over the passivation layer. The first dielectric layer extends into the opening to form an air gap enclosed by the first dielectric layer and the passivation layer. The method further includes simultaneously forming a first metal layer and a first redistribution layer (RDL) over the first dielectric layer. The first metal layer and the first RDL form a continuous layer. In addition, the method includes forming a first insulating layer to cover the first metal layer and the first RDL, and forming a second metal layer over the first insulating layer. The first metal layer, the second metal layer and a portion of the first insulating layer therebetween form a first metal-insulator-metal (MIM) capacitor, and the first RDL is electrically connected to the first conductive portion through the first MIM capacitor.

The embodiments of the present disclosure have some advantageous features. By combining an anti-fuse, a metal-insulator-metal capacitor and a redistribution layer in a semiconductor device, the integration of the semiconductor device may be increased, and the overall size of the semiconductor device may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a first conductive portion and a second conductive portion disposed over a semiconductor substrate;
a passivation layer covering the first conductive portion and the second conductive portion, wherein the first conductive portion, the second conductive portion and a portion of the passivation layer therebetween form an anti-fuse; and
a first metal-insulator-metal (MIM) capacitor and a first redistribution layer (RDL) disposed over the passivation layer, wherein the first MIM capacitor and the first RDL are electrically connected to the first conductive portion, and a first metal layer of the first MIM capacitor is integrally formed with the first RDL;
wherein the anti-fuse has an air gap between the first conductive portion and the second conductive portion and surrounded by the passivation layer.

2. The semiconductor device of claim 1, further comprising:
a first insulating layer covering the first metal layer and the first RDL; and
a second metal layer disposed over the first insulating layer, wherein the first metal layer, the second metal layer and a portion of the first insulating layer therebetween form the first MIM capacitor.

3. The semiconductor device of claim 1, wherein the first RDL is not covered by the second metal layer.

4. The semiconductor device of claim 1, further comprising:
a second metal-insulator-metal (MIM) capacitor and a second redistribution layer (RDL) disposed over the passivation layer, wherein the second MIM capacitor and the second RDL are electrically connected to the second conductive portion, and a third metal layer of the second MIM capacitor is integrally formed with the second RDL.

5. The semiconductor device of claim 4, further comprising:
a second insulating layer covering the third metal layer and the second RDL; and
a fourth metal layer disposed over the second insulating layer, wherein the third metal layer, the fourth metal layer and a portion of the second insulating layer therebetween form the second MIM capacitor.

6. The semiconductor device of claim 4, further comprising:
a dielectric layer covering the first MIM capacitor, wherein the second MIM capacitor and the second RDL are disposed over the dielectric layer.

7. A semiconductor device, comprising:
a first conductive portion and a second conductive portion disposed over a semiconductor substrate;
a passivation layer covering the first conductive portion and the second conductive portion;
a first conductive plug penetrating through the passivation layer and contacting the first conductive portion;
a second conductive plug penetrating through the passivation layer and contacting the second conductive portion;
an anti-fuse disposed between the first conductive plug and the second conductive plug;
a first metal-insulator-metal (MIM) capacitor disposed over the first conductive plug;
a first redistribution layer (RDL) physically connecting a first metal layer of the first MIM capacitor, wherein the first RDL is electrically connected to the first conductive portion through the first metal layer of the first MIM capacitor and the first conductive plug; and
a dielectric layer disposed over the passivation layer, wherein the anti-fuse has an air gap enclosed by the dielectric layer and the passivation layer, and the air gap extends between the first conductive portion and the second conductive portion.

8. The semiconductor device of claim 7, wherein a conductive filament is formed between the first conductive portion and the second conductive portion and penetrating through the passivation layer and the air gap after the anti-fuse is programmed.

9. The semiconductor device of claim 7, wherein the first MIM capacitor further comprises:
a second metal layer disposed over the first metal layer; and
a first insulating layer sandwiched between the first metal layer and the second metal layer,
wherein the first insulating layer extends to cover the first RDL.

10. The semiconductor device of claim 7, further comprising:
a second metal-insulator-metal (MIM) capacitor disposed over the second conductive plug; and
a second redistribution layer (RDL) physically connecting a third metal layer of the second MIM capacitor, wherein the second RDL is electrically connected to the second conductive portion through the third metal layer of the second MIM capacitor and the second conductive plug.

11. The semiconductor device of claim 10, wherein the second MIM capacitor further comprises:

a fourth metal layer disposed over the third metal layer; and a second insulating layer sandwiched between the third metal layer and the fourth metal layer, wherein the second insulating layer extends to cover the second RDL.

12. The semiconductor device of claim 10, wherein at least a portion of the second RDL overlaps with at least a portion of the first MIM capacitor.

13. A method for forming a semiconductor device, comprising:

forming a first conductive portion and a second conductive portion over a semiconductor substrate;

depositing a passivation layer over the first conductive portion and the second conductive portion, wherein an opening is formed over the passivation layer and between the first conductive portion and the second conductive portion;

depositing a first dielectric layer over the passivation layer, wherein the first dielectric layer extends into the opening to form an air gap enclosed by the first dielectric layer and the passivation layer;

simultaneously forming a first metal layer and a first redistribution layer (RDL) over the first dielectric layer, wherein the first metal layer and the first RDL form a continuous layer; forming a first insulating layer to cover the first metal layer and the first RDL; and forming a second metal layer over the first insulating layer, wherein the first metal layer, the second metal layer and a portion of the first insulating layer therebetween form a first metal-insulator-metal (MIM) capacitor, and wherein the first RDL is electrically connected to the first conductive portion through the first MIM capacitor.

14. The method for forming a semiconductor device of claim 13, wherein the first conductive portion, the second conductive portion, a portion of the passivation layer therebetween and the air gap form an anti-fuse.

15. The method for forming a semiconductor device of claim 14, further comprising:

applying a programming voltage to the anti-fuse to form a conductive filament penetrating through the portion of the passivation layer and the air gap.

16. The method for forming a semiconductor device of claim 13, further comprising:

forming a second dielectric layer over the first MIM capacitor; and simultaneously forming a third metal layer and a second redistribution layer (RDL) over the second dielectric layer, wherein the third metal layer and the second RDL form a continuous layer.

17. The method for forming a semiconductor device of claim 16, further comprising:

forming a second insulating layer to cover the third metal layer and the second RDL; and forming a fourth metal layer over the second insulating layer, wherein the third metal layer, the fourth metal layer and a portion of the second insulating layer therebetween form a second metal-insulator-metal (MIM) capacitor.

18. The method for forming a semiconductor device of claim 17, wherein the second RDL is electrically connected to the second conductive portion through the second MIM capacitor.

* * * * *